(12) United States Patent
Otsuji

(10) Patent No.: US 10,903,256 B2
(45) Date of Patent: *Jan. 26, 2021

(54) FOCUS DETECTING DEVICE AND ELECTRONIC DEVICE

(71) Applicant: SONY CORPORATION, Tokyo (JP)

(72) Inventor: Hironari Otsuji, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/575,098

(22) Filed: Sep. 18, 2019

(65) Prior Publication Data

US 2020/0013817 A1 Jan. 9, 2020

Related U.S. Application Data

(63) Continuation of application No. 14/895,804, filed as application No. PCT/JP2015/060550 on Apr. 3, 2015, now Pat. No. 10,453,883.

(30) Foreign Application Priority Data

Apr. 15, 2014 (JP) .................................. 2014-083363

(51) Int. Cl.
*H01L 27/146* (2006.01)
*G01J 1/44* (2006.01)
(Continued)

(52) U.S. Cl.
CPC .......... *H01L 27/14623* (2013.01); *G01J 1/44* (2013.01); *G02B 7/34* (2013.01);
(Continued)

(58) Field of Classification Search
CPC ...... G01J 1/44; G01J 2001/448; H04N 5/335; H01L 27/146; H01L 27/14601; H01L 27/14625; H01L 27/14627; H01L 27/1462; H01L 27/14623; G02B 7/34; G02B 7/28; G02B 3/0056; G02B 23/24; G02B 23/2407

See application file for complete search history.

(56) References Cited

U.S. PATENT DOCUMENTS 10,453,883 B2 * 10/2019 Otsuji ............... H01L 27/14623
2007/0188635 A1 * 8/2007 Yamaguchi ....... H01L 27/14621
348/272

(Continued)

*Primary Examiner* — John R Lee
(74) *Attorney, Agent, or Firm* — Sheridan Ross P.C.

(57) ABSTRACT

The present technology relates to a focus detecting device and an electronic device that can adjust the maximum value and the minimum value of sensitivity in phase detection pixels. The focus detecting device and an electronic device each include a microlens, a photoreceptor configured to receive light entering through the microlens, a light shield film provided between the microlens and the photoreceptor and configured to limit an amount of light on the photoreceptor, and a light shield wall provided vertical to the light shield film. The light shield wall or the light shield walls having a predetermined height are provided on any one or both of surfaces of the light shield film facing the photoreceptor and the microlens. The present technology can be applied to an imaging device configured to detect a focus by detection of phase difference.

15 Claims, 21 Drawing Sheets

(51) Int. Cl.
*G02B 7/34* (2006.01)
*G02B 3/00* (2006.01)
*G02B 23/24* (2006.01)

(52) U.S. Cl.
CPC ...... *H01L 27/14627* (2013.01); *G02B 3/0056* (2013.01); *G02B 23/24* (2013.01)

(56) References Cited

U.S. PATENT DOCUMENTS

| | | | | |
|---|---|---|---|---|
| 2007/0290284 A1* | 12/2007 | Shaffer | ............... | H01L 27/1446 257/432 |
| 2008/0272454 A1* | 11/2008 | Toshikiyo | ............ | G02B 5/1876 257/443 |
| 2009/0101946 A1* | 4/2009 | Hwang | ............ | H01L 27/14623 257/290 |
| 2009/0295964 A1* | 12/2009 | Utagawa | ............ | H04N 5/2254 348/302 |
| 2010/0245631 A1* | 9/2010 | Hoda | ............ | G03B 13/36 348/241 |
| 2010/0283998 A1* | 11/2010 | Souchkov | ............ | G01J 1/02 356/141.2 |
| 2010/0302432 A1* | 12/2010 | Komuro | ............ | H04N 5/23212 348/340 |
| 2011/0037883 A1* | 2/2011 | Lee | ............ | H01L 27/14623 348/273 |
| 2011/0242376 A1* | 10/2011 | Ando | ............ | H01L 27/14623 348/294 |
| 2011/0279727 A1* | 11/2011 | Kusaka | ............ | H01L 27/14621 348/340 |
| 2012/0075509 A1* | 3/2012 | Ito | ............ | H01L 27/14621 348/265 |
| 2012/0086093 A1* | 4/2012 | Otsuka | ............ | H01L 27/14621 257/432 |
| 2012/0112254 A1* | 5/2012 | Nagano | ............ | H01L 27/14818 257/292 |
| 2013/0015545 A1* | 1/2013 | Toumiya | ............ | H01L 27/14605 257/432 |
| 2013/0016274 A1* | 1/2013 | Matsuo | ............ | H04N 5/23212 348/345 |
| 2014/0104474 A1* | 4/2014 | Tange | ............ | H01L 27/14627 348/308 |
| 2014/0110809 A1* | 4/2014 | Kitamura | ............ | H01L 27/14623 257/435 |
| 2014/0264686 A1* | 9/2014 | Tu | ............ | H01L 27/14627 257/432 |
| 2015/0076322 A1* | 3/2015 | Pang | ............ | H01L 27/14645 250/208.1 |
| 2015/0124140 A1* | 5/2015 | Ohkubo | ............ | H01L 27/1463 348/308 |
| 2016/0118429 A1* | 4/2016 | Otsuji | ............ | G01J 1/44 250/206 |

\* cited by examiner

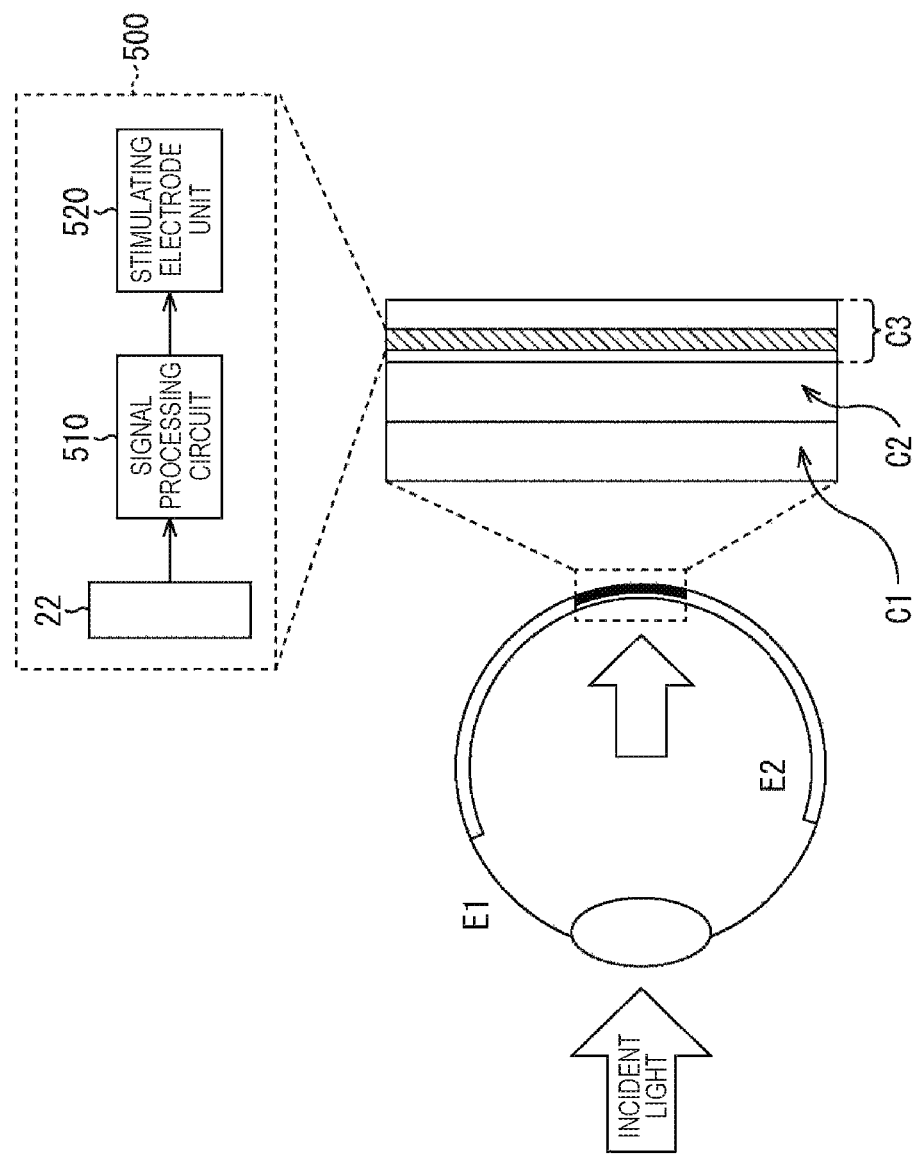

FOCUS DETECTING DEVICE AND ELECTRONIC DEVICE

CROSS REFERENCE TO RELATED APPLICATIONS

This application is a continuation of U.S. patent application Ser. No. 14/895,804, filed Dec. 3, 2015, which is a national stage application under 35 U.S.C. 371 and claims the benefit of PCT Application No. PCT/JP2015/060550 having an international filing date of Apr. 3, 2015, which designated the United States, which PCT application claimed the benefit of Japanese Patent Application No. 2014-083363 filed Apr. 15, 2014, the disclosures of which are incorporated herein by reference in their entirety.

TECHNICAL FIELD

The present technology relates to focus detecting devices and electronic devices. More particularly, the present technology relates to a focus detecting device and an electronic device that detect a focus more accurately.

BACKGROUND ART

Autofocus systems in digital cameras mainly include contrast system and phase difference system. The contrast system involves moving lenses to achieve focus at the highest contrast. In digital cameras, autofocus is achieved by reading a part of an image captured by an image sensor, which eliminates the need for an optical system for autofocus.

The phase difference system employs what is called triangulation techniques for determining the distance from a subject to two different points by measuring an angular difference between the subject and the two points. For the phase difference system, the images of light passing through different regions of a lens, for example, the flux of light at the left and right sides of a lens is used. In the phase difference system, how long the lens needs to be moved to a focal position is achieved is determined by measuring the distance.

Image-plane phase difference autofocus performs autofocus with the phase difference system using an image sensor. The image sensor has condensing microlenses. The image sensor is further provided with a diaphragm for limiting light incident on the microlenses to give an image sensor for phase-difference autofocus (see, for example, Patent Literature 1).

CITATION LIST

Patent Literature

Patent Literature 1: JP 2011-165736A

SUMMARY OF INVENTION

Technical Problem

The contrast system may take a long time to obtain focus since lenses need to be moved back and forth to detect the highest contrast. As compared with the contrast system, the phase difference system achieves high-speed autofocus since it does not require the time for moving lenses back and forth to detect focal positions.

The image-plane phase difference system, however, includes a diaphragm, (e.g., light shield film) configured to limit light incident on microlenses. This limits the amount of light incident on an image sensor to degrade sensitivity. That is, the image-plane phase difference system uses, for example, the flux of light at the right and left sides of a lens is used, or a part of light incident on the lens is used, so that the amount of light incident on an image sensor decreases to degrade sensitivity.

Since the flux of light at the right and left sides is used in the image-plane phase difference system, light passing through the right side of the lens needs to enter a right image sensor and light passing through the left side of the lens needs to enter a left image sensor. In other words, light passing through the left side of the lens is controlled not to enter the right image sensor, whereas light passing through the right side of the lens is controlled not to enter the left image sensor.

Patent Literature 1 describes that a reflector is used to reflect unnecessary light so that light passing through the left side of a lens is controlled not to enter a right image sensor and light passing through the right side of the lens is controlled not to enter a left image sensor. In Patent Literature 1, however, the amount of light incident on the image sensors also decreases to degrade sensitivity.

Thus, it has been difficult to control the sensitivity of the image sensor.

The present technology has been made in light of such circumstances to obtain a desired sensitivity.

Solution to Problem

A first focus detecting device according to an aspect of the present technology includes: a microlens a photoreceptor configured to receive light entering through the microlens; a light shield film provided between the microlens and the photoreceptor and configured to limit an amount of light on the photoreceptor; and a light shield wall provided vertical to the light shield film.

The light shield wall can be provided at an opening of the light shield film.

The light shield wall can be provided on a surface of the light shield film facing the microlens.

The light shield wall can be provided on a surface of the light shield film facing the photoreceptor.

The light shield walls can be provided on both surfaces of the light shield film facing the microlens and the photoreceptor.

A cover area of the light shield film over the photoreceptor can be reduced and the light shield wall having a predetermined height can be provided on a surface of the light shield film facing the microlens to maintain a maximum value of sensitivity of the photoreceptor obtained when the focus detecting device includes the light shield film without the light shield wall, and to increase a minimum value of the sensitivity.

The light shield wall having a predetermined height can be provided on a surface of the light shield film facing the microlens to maintain a minimum value of sensitivity of the photoreceptor obtained when the focus detecting device includes the light shield film without the light shield wall, and to decrease a maximum value of the sensitivity.

A cover area of the light shield film over the photoreceptor can be reduced and the light shield wall having a predetermined height can be provided on a surface of the light shield film facing the microlens to decrease a maximum value of sensitivity of the photoreceptor obtained when the focus detecting device includes the light shield film without the light shield wall, and to increase a minimum value of the sensitivity.

A cover area of the light shield film over the photoreceptor can be reduced and the light shield wall having a predetermined height can be provided on a surface of the light shield film facing the photoreceptor to maintain a minimum value of sensitivity of the photoreceptor obtained when the focus detecting device includes the light shield film without the light shield wall, and to increase a maximum value of the sensitivity.

The light shield wall having a predetermined height can be provided on a surface of the light shield film facing the photoreceptor to maintain a maximum value of sensitivity of the photoreceptor obtained when the focus detecting device includes the light shield film without the light shield wall, and to increase a minimum value of the sensitivity.

A cover area of the light shield film over the photoreceptor can be reduced and the light shield wall having a predetermined height can be provided on a surface of the light shield film facing the photoreceptor to increase a maximum value of sensitivity of the photoreceptor obtained when the focus detecting device includes the light shield film without the light shield wall, and to decrease a minimum value of the sensitivity.

The light shield walls having a predetermined height can be provided on both surfaces of the light shield film facing the microlens and the photoreceptor to decrease a maximum value of sensitivity of the photoreceptor obtained when the focus detecting device includes the light shield film without the light shield wall, and to decrease a minimum value of the sensitivity.

A second focus detecting device according to an aspect of the present technology includes: a microlens; a photoreceptor configured to receive light entering through the microlens; and a plurality of light shield films provided between the microlens and the photoreceptor and configured to limit an amount of light on the photoreceptor.

The focus detecting device according to claim 13, wherein a cover area of a light shield film closer to the microlens, of the plurality of light shield curtains, over the photoreceptor is made smaller than a cover area of a light shield film closer to the photoreceptor over the photoreceptor to maintain a maximum value of sensitivity of the photoreceptor obtained when the light shield films are single-layered, and to increase a minimum value of the sensitivity.

An electronic device according to an aspect of the present technology includes: a microlens; a photoreceptor configured to receive light entering through the microlens; a light shield film provided between the microlens and the photoreceptor and configured to limit an amount of light on the photoreceptor; a light shield wall provided vertical to the light shield film; a detector configured to detect a focus using a signal from the photoreceptor; and a signal processing unit configured to process a signal outputted from the photoreceptor without the light shield film.

A third focus detecting device according to an aspect of the present technology includes: a lens array including a plurality of lenses; a photoreceptor including a plurality of light-receiving pixels; and a light shield unit provided between the lens array and the photoreceptor in a first direction. The lens array includes a first lens and a second lens. The photoreceptor includes a first light-receiving pixel opposite to the first lens and a second light-receiving pixel opposite to the second lens. The light shield unit includes a first protrusion region that overlaps the first lens and protrudes in the first direction and a second protrusion region that overlaps the second lens and protrudes in the first direction.

The light shield unit can include a light shield film that overlaps the first lens and the second lens, a first light shield wall that extends in the first direction in the first protrusion region, and a second light shield wall that extends in the first direction in the second protrusion region.

The first light shield wall and the second light shield wall can be thicker than the light shield film in the first direction.

A first focus detecting device according to an aspect of the present technology includes: a microlens; a photoreceptor configured to receive light entering through the microlens; a light shield film provided between the microlens and the photoreceptor and configured to limit an amount of light on the photoreceptor; and a light shield wall provided vertical to the light shield film.

A second focus detecting device according to an aspect of the present technology includes: a microlens; a photoreceptor configured to receive light entering through the microlens; and a plurality of light shield films provided between the microlens and the photoreceptor and configured to limit an amount of light on the photoreceptor.

A third focus detecting device according to an aspect of the present technology includes: a lens array including a plurality of lenses; a photoreceptor including a plurality of light-receiving pixels; and a light shield unit provided between the lens array and the photoreceptor in a first direction. The lens array includes a first lens and a second lens. The photoreceptor includes a first light-receiving pixel opposite to the first lens and a second light-receiving pixel opposite to the second lens. The light shield unit includes a first protrusion region that overlaps the first lens and protrudes in the first direction and a second protrusion region that overlaps the second lens and protrudes in the first direction.

An electronic device according to an aspect of the present invention includes the focus detecting device.

Advantageous Effects of Invention

According to an aspect of the present technology, a desired sensitivity can be obtained.

The advantages described here should not be construed as restrictive and may be any of the advantages described in the present disclosure.

BRIEF DESCRIPTION OF DRAWINGS

FIG. 32 is a functional block diagram illustrating an entire configuration according to an application example (vision tip).

DESCRIPTION OF EMBODIMENTS

Modes for carrying out the present technology (hereinafter referred to as embodiments) will be described below. The description is provided in the following order.

1. Configuration of Imaging Device
2. Configuration of Image Sensor
3. Autofocus with Image-Plane Phase Difference System
4. Configuration of Focus Detecting Device According to First Embodiment
5. Configuration of Focus Detecting Device According to Second Embodiment
6. Configuration of Focus Detecting Device According to Third Embodiment
7. Configuration of Focus Detecting Device According to Fourth Embodiment
8. Configuration of Focus Detecting Device According to Fifth Embodiment
9. Configuration of Focus Detecting Device According to Sixth Embodiment
10. Configuration of Focus Detecting Device According to Seventh Embodiment
11. Configuration of Focus Detecting Device According to Eighth Embodiment
12. Application Examples <Configuration of Imaging Apparatus>

The present technology described below can be applied to autofocus mechanisms of, for example, digital cameras. Autofocus systems mainly include contrast system and phase difference system, and the present technology can be applied to the phase difference system. In the following description, image-plane phase difference autofocus will be described as an example.

Image-plane phase difference autofocus can be applied to general electronic devices having a semiconductor package in an image capturing unit (photoelectric converter), wherein general electronic devices include imaging devices, such as digital still cameras and video cameras, mobile terminals having an imaging function, such as mobile phones, and copying machines having an imaging device in an image reader.

Figure 1:
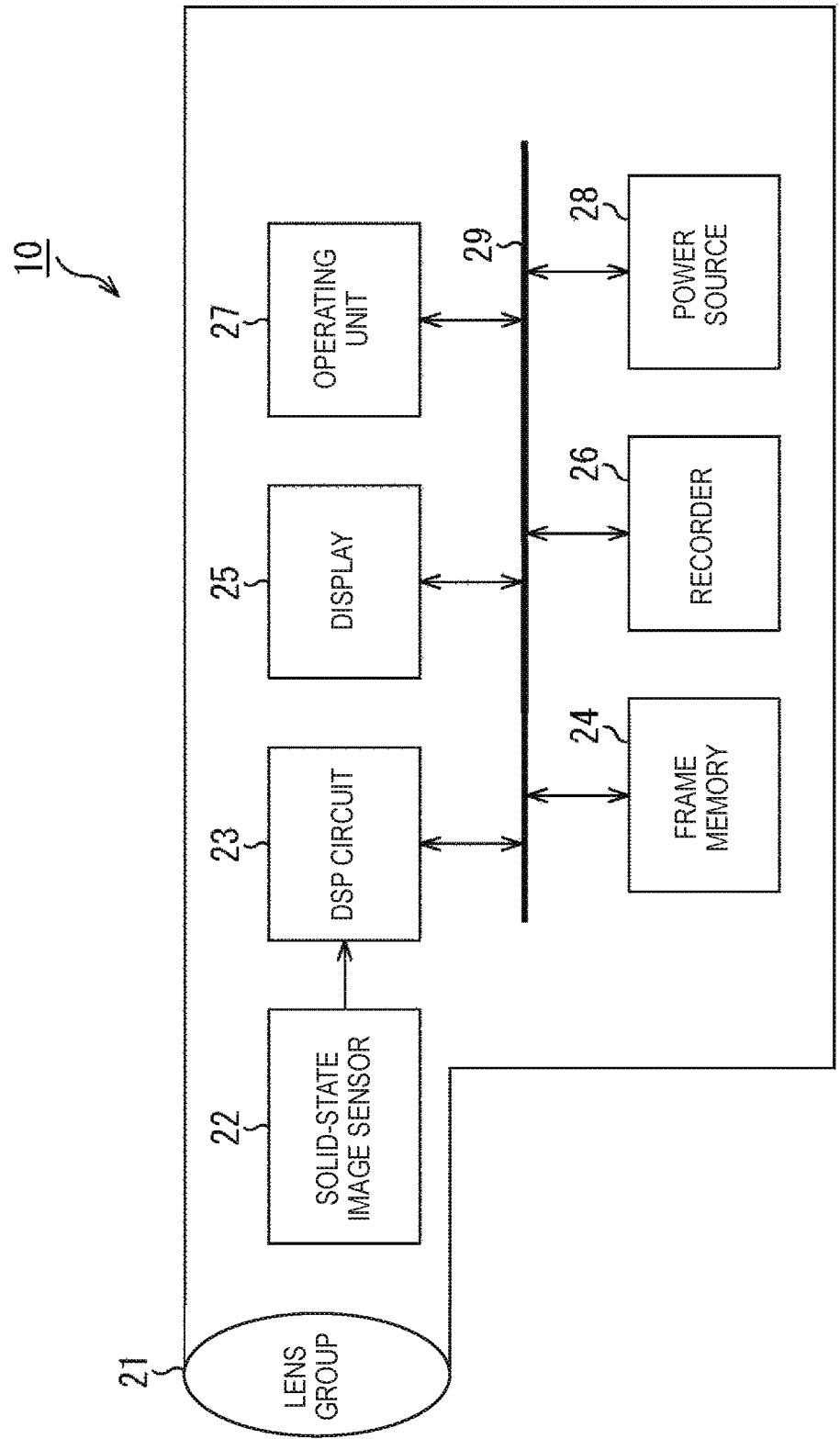
FIG. 1 is a diagram illustrating a configuration of an imaging device.

FIG. 1 is a block diagram illustrating an exemplary configuration of an electronic device, for example an imaging device, according to the present technology. As shown in FIG. 1, an imaging device 10 according to the present technology includes an optical system including a lens group 21, a solid-state image sensor (imaging device) 22, a digital signal processor (DSP) circuit 23, a frame memory 24, a display 25, a recorder 26, an operating unit 27, and a power source 28. The DSP circuit 23, the frame memory 24, the display 25, the recorder 26, the operating unit 27, and the power source 28 are connected to each other through a bus line 29.

The lens group 21 takes incident light (image light) reflected from a subject, and forms an image on an imaging surface of the solid-state image sensor 22. The solid-state image sensor 22 converts the amount of incident light focused on the imaging surface by the lens group 21 into electric signals on a pixel-by-pixel basis and outputs the electric signals as pixel signals.

The DSP circuit 23 processes signals from the solid-state image sensor 22. For example, the solid-state image sensor 22 includes pixels for detecting a focus, and processes signals from the pixels to detect a focus, as described below in detail. The solid-state image sensor 22 includes pixels for constructing the image of captured subject and processes signals from the pixels to develop the pixels into the frame memory 24.

The display 25 is composed of a panel-type display, such as a liquid crystal display or an organic electro luminescence (EL) display, and displays moving or still pictures captured by the solid-state image sensor 22. The recorder 26 records the moving or still pictures captured by the solid-state image sensor 22 in recording media such as video tapes or digital versatile disks (DVDs).

The operating unit 27 issues operation commands for various functions of the imaging device under user's operation. The power source 28 appropriately supplies various types of powers that function as power for operating the DSP circuit 23, the frame memory 24, the display 25, the recorder 26, and the operating unit 27 to such supply targets.

The imaging device having the above configuration can be used as an imaging device, for example, a video camera, a digital still camera, a camera module for mobile devices, such as mobile phones. In the imaging device, a semiconductor package including phase difference detection pixels as described below can be used as the solid-state image sensor 22.

<Configuration of Image Sensor>

Figure 2:
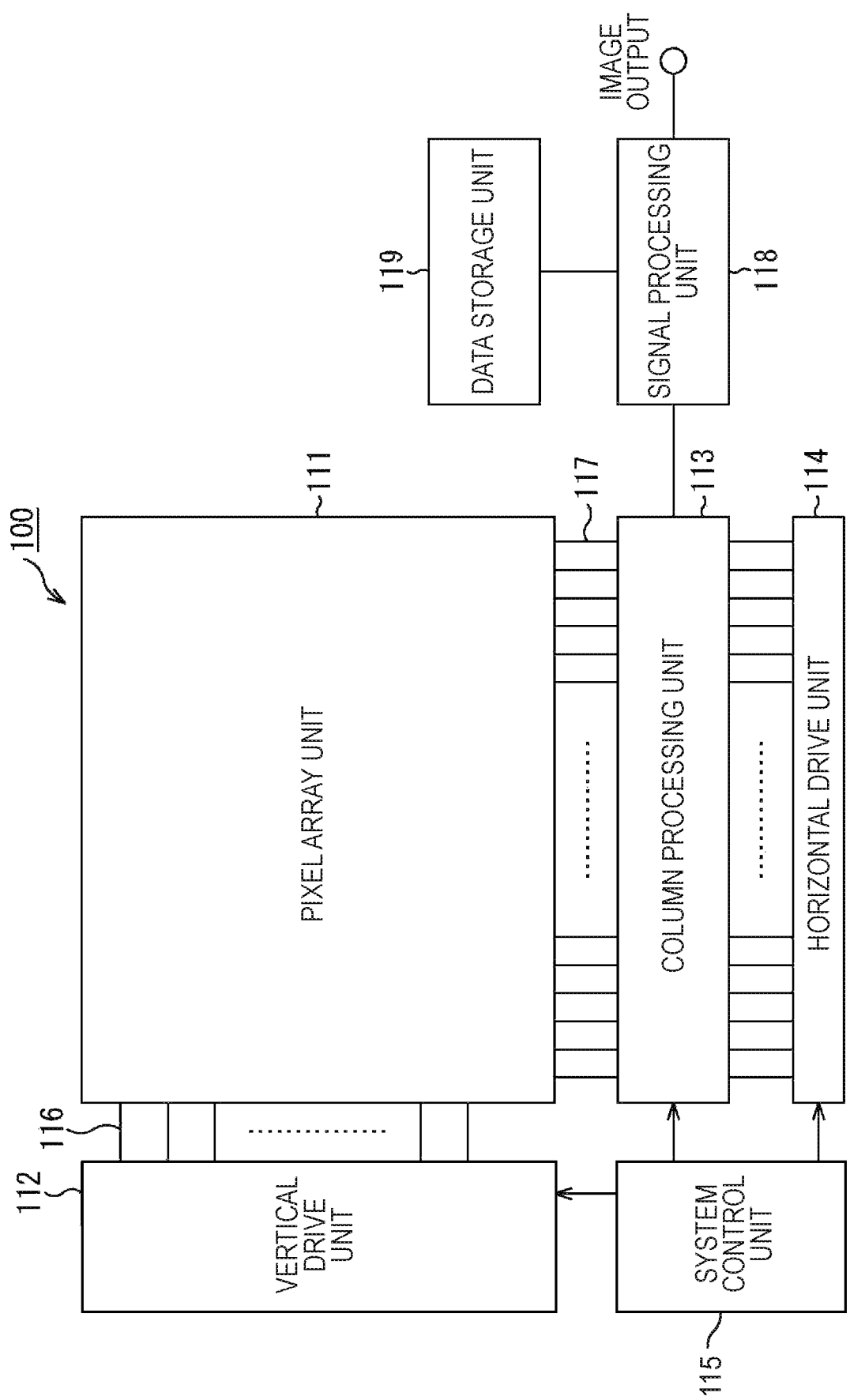
FIG. 2 is a diagram illustrating a configuration of a solid-state image sensor.

FIG. 2 is a diagram illustrating the configuration of a solid-state image sensor 22, for example, a system configuration diagram illustrating the outline of the configuration of a CMOS image sensor, which is a type of X-Y address type imaging device. As used herein, the CMOS image sensor refers to an image sensor produced by applying or partially using CMOS process.

The CMOS image sensor 100 in FIG. 2 includes a pixel array unit 111 formed on a semiconductor substrate, not shown, and peripheral circuit units integrated on the same semiconductor substrate as for the pixel array unit 111. The peripheral circuit units include, for example, a vertical drive unit 112, a column processing unit 113, a horizontal drive unit 114, and a system control unit 115.

The CMOS image sensor 100 further includes a signal processing unit 118 and a data storage unit 119. The signal processing unit 118 and a data storage unit 119 may be mounted on the same substrate as of the CMOS image sensor 100 or may be mounted on a substrate different from that of the CMOS image sensor 100. The processing in the signal processing unit 118 and the data storage unit 119 may be performed by external signal processing units, for example, a digital signal processor (DSP) circuit or software, provided on a substrate different from that of the CMOS image sensor 100.

The pixel array unit 111 includes unit pixels (hereinafter may be referred to as "pixels") arranged in row and column directions, that is, two-dimensionally arranged in a matrix, wherein the unit pixels have a photoelectric converter configured to generate and accumulate photocharges according to the amount of received light. As used herein, the row direction refers to the pixel array direction of pixel rows (e.g., horizontal direction), and the column direction refers to the pixel array direction of pixel columns (e.g., vertical direction).

In the matrix pixel array in the pixel array unit 111, each of the pixel drive lines 116 is provided for each pixel row in the row direction and each of the vertical signal lines 117 is provided for each pixel column in the column direction. The pixel drive lines 116 transmit drive signals for performing drive in reading signals from the pixels. In FIG. 1, each pixel drive line 116 is shown as a single wire, but is not limited to a single wire. One end of the pixel drive line 116 is connected to an output end corresponding to each row of the vertical drive unit 112.

The vertical drive unit 112 includes a shift register and an address decoder, and drives all pixels at the same time or pixels in each row unit or the like for the pixels in the pixel array unit 111. That is, the vertical drive unit 112, together with the system control unit 115 configured to control the vertical drive unit 112, forms a drive unit configured to drive the pixels in the pixel array unit 111. Although the detailed configuration of the vertical drive unit 112 is not shown in the drawing, the vertical drive unit 112 generally includes two scan systems, a read scan system and a sweep scan system.

The read scan system sequentially conducts selective scan on the unit pixels of the pixel array unit 111 in row units in order to read signals from the unit pixels. The signals read from the unit pixels are analog signals. The sweep scan system conducts sweep scan on read rows to be read-scanned by the read scan system, prior to the read scan by a shutter speed time.

The sweep scan with the sweep scan system sweeps out excess charges from the photoelectric converters for the unit pixels in read rows to reset the photoelectric converters. Sweeping out excess charges (resetting) with the sweep scan system activates a so-called electronic shutter operation. As used herein, the electronic shutter operation refers to an operation to remove photocharges in the photoelectric converters and start new exposure (start accumulation of photocharges).

The signals read by the read operation with the read scan system correspond to the amount of light received after the last read operation or the electronic shutter operation. The period from a read timing by the last read operation or a sweep timing by the electronic shutter operation to a read timing by the current read operation is an exposure period of photocharges in the unit pixels.

The signals outputted from the unit pixels in the pixel rows that are selectively scanned by the vertical drive unit 112 are inputted to the column processing unit 13 through the vertical signal lines 117 for the respective pixel columns. The column processing unit 113 conducts predetermined signal processing on signals outputted from the pixels in the selected rows through the vertical signal lines 117 for the respective pixel columns of the pixel array unit 111, and temporarily stores pixel signals after signal processing.

Specifically, the column processing unit 113 performs at least noise removing process, for example, correlated double sampling (CDS) process as signal processing. The CDS process with the column processing unit 113 removes fixed pattern noise unique to pixels, such as reset noise or the threshold variation of an amplification transistor in a pixel. The column processing unit 113 may be further provided with an analog-digital (AD) conversion function to covert analog pixel signals into digital signals and output the digital signals, in addition to the noise removing process.

The horizontal drive unit 114 includes a shift register and an address decoder, and sequentially selects a unit circuit corresponding to the pixel column of the column processing unit 113. The selective scan with the horizontal drive unit 114 allows sequential output of pixel signals processed per unit circuit in the column processing unit 113.

The system control unit 115 includes a timing generator configured to generate various timing signals, and performs drive control on the vertical drive unit 112, the column processing unit 113, the horizontal drive unit 114, and the like based on the various timings generated by the timing generator.

The signal processing unit 118 has at least an arithmetic processing function, and performs various types of signal processing, such as arithmetic processing, on pixel signals outputted from the column processing unit 113. The data storage unit 119 temporarily stores data required for signal processing in the signal processing unit 118.

Figure 3:
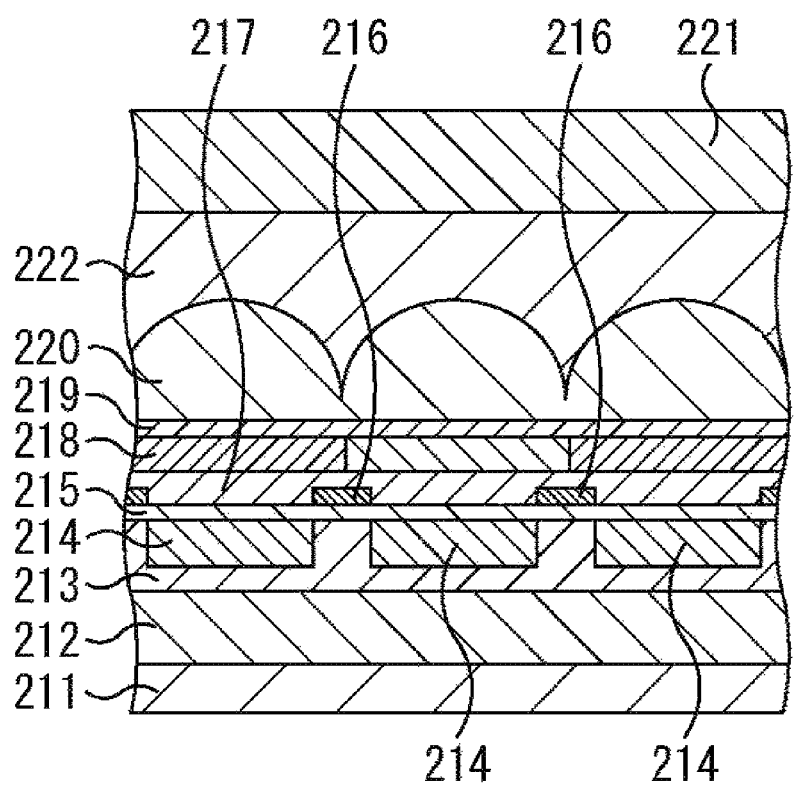
FIG. 3 is a diagram illustrating a configuration of a semiconductor package.

FIG. 3 is a cross-sectional diagram schematically illustrating the basic configuration of the semiconductor package constituting the CMOS image sensor 100 in FIG. 2, which is an imaging device employing the present technology. The semiconductor package 200 in FIG. 3 constitutes a backside irradiation-type CMOS image sensor.

In the semiconductor package 200 in an effective pixel area shown in FIG. 3, a wiring layer 212 made of $SiO_2$ is formed on a support substrate 211, and a silicon substrate 213 is formed on the wiring layer 212. Silicon, glass epoxy, glass, plastic, or the like is used for the support substrate 211. Multiple photodiodes 214 (optical elements) are formed at predetermined intervals on the surface of the silicon substrate 213 as the photoelectric converters for the pixels.

A protective film 215 made of SiO$_2$ is formed on the silicon substrate 213 and the photodiodes 214. A light shield film 216 is formed on the protective film 215 between the adjacent photodiodes 214 in order to avoid leakage of light into the adjacent pixels. Although the light shield film 216 for avoiding leakage of light into the adjacent pixels are provided, a light shield film 216 for preventing excess light from entering pixels for focus detection may be provided as described below.

A flattening film 217 is provided on the protective film 215 and the light shield film 216 to flatten an area on which a color filter is to be formed. A color filter layer 218 is formed on the flattening film 217. In the color filter layer 218, multiple color filters are provided for the pixels respectively, and the colors of the respective color filters are disposed, for example, in a Bayer array.

A first organic material layer 219 is formed on the color filter layer 218. The first organic material layer 219 is made of, for example, an acrylic resin material, a styrene resin material, or an epoxy resin material. Microlenses 220 are formed on the first organic material layer 219. The microlenses 220 are thus formed on the substrate including multiple layers and having the photodiodes 214. In the microlenses 220, microlenses for condensing light on the photodiodes 214 of the pixels are formed for the pixels, respectively. The microlenses 220 are formed in an inorganic material layer and are made of SiN, SiO, or SiOxNy (where 0<x≤1 and 0<y≤1).

A cover glass 221 is bonded to the upper parts of the microlenses 220 through a second organic material layer 222. The cover glass 221 is not limited to glass, and a transparent plate, such as resin, may be used. A protective film may be formed between the microlenses 220 and the cover glass 221 to prevent permeation of water and impurities. The second organic material layer 222 is made of, for example, an acrylic resin material, a styrene resin material, or an epoxy resin material as in the first organic material layer 219.

The configuration shown in FIG. 3 is illustrative only, and the present technology described below can be applied to other configurations, for example, configurations further including other layers in addition to the above layers or lacking any of the above layers.

<Autofocus with Image-Plane Phase Difference System>

Figure 4:
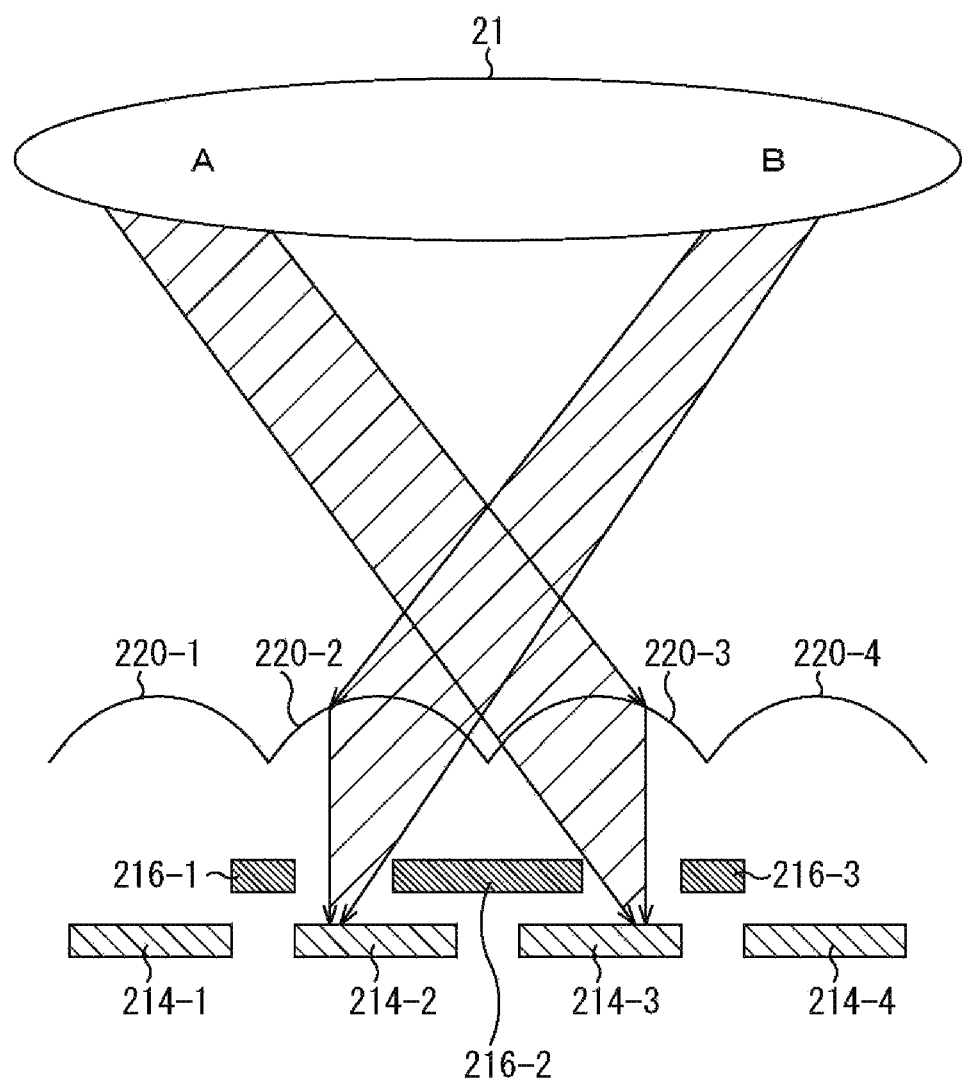
FIG. 4 is a diagram for describing focus detection with a phase difference system.

FIG. 4 is a diagram for describing image-plane phase difference autofocus. A predetermined number of pixels in the pixel array unit 111 in which the pixels are two-dimensionally arranged in a matrix are assigned to phase difference detection pixels. Multiple phase difference detection pixels are provided at predetermined positions in the pixel array unit 111.

The configuration of the phase difference detection pixels shown in FIG. 4 corresponds to a part of the solid-state image sensor 22 shown in FIGS. 2 and 3. FIG. 4 is a diagram illustrating a part of the solid-state image sensor 22 including the phase difference detection pixels and a diagram illustrating an extracted part necessary for the following description. Hereinafter, a device including phase difference detection pixels and including a focus defecting part is appropriately referred to as a focus detecting device.

The phase difference detection pixels are pixels used for detecting a focus with phase difference system and the imaging pixels are pixels that are different from phase difference detection pixels and are used for imaging.

The focus detecting device shown in FIG. 4 includes a lens group 21, microlenses 220-1 to 220-4, light shield films 216-1 to 216-3, and photodiodes 214-1 to 214-4.

In the solid-state image sensor shown in FIG. 4, the photodiodes 214-2 and 214-3 function as phase difference detection pixels and are taken as pixels for acquiring image signals for autofocusing (focus detection). The photodiodes 214-1 and 214-4, which are disposed to sandwich the photodiodes 214-2 and 214-3, are used as imaging pixels and are taken as pixels for acquiring image signals based on light reflected from a subject.

The photodiode 214-1 receives light reflected from a subject and condensed by the microlens 220-1. The photodiode 214-2 receives light reflected from a subject and condensed by the microlens 220-2. The photodiode 214-3 receives light reflected from a subject and condensed by the microlens 220-3. The photodiode 214-4 receives light reflected from a subject and condensed by the microlens 220-4.

The light shield film 216-1 is provided to prevent light from the microlens 220-1 from entering the photodiode 214-2 and light from the microlens 220-2 from entering the photodiode 214-1. Similarly, the light shield film 216-3 is provided to prevent light from the microlens 220-4 from entering the photodiode 214-3 and light from the microlens 220-3 from entering the photodiode 214-4.

The light shield films 216-1 and 216-3 are provided between the adjacent photodiodes 214 to avoid leakage of light into adjacent pixels (photodiodes). With regard to the light shield film 216, the light shield film 216-3 also has a function to realize a function of receiving light at a selected angle of incidence (hereinafter referred to as separation ability) in addition to the function of avoiding leakage of light into the adjacent pixels (photodiodes).

That is, as shown in FIG. 4, the light shield film 216-2 is provided from approximately the center of the photodiode 214-2 to approximately the center of the photodiode 214-3 such that light passing through the A side of the lens group 21 (left side of the drawing) is incident on the photodiode 214-3, and light passing through the B side of the lens group 21 (right side of the drawing) is incident on the photodiode 214-2.

Figure 5:
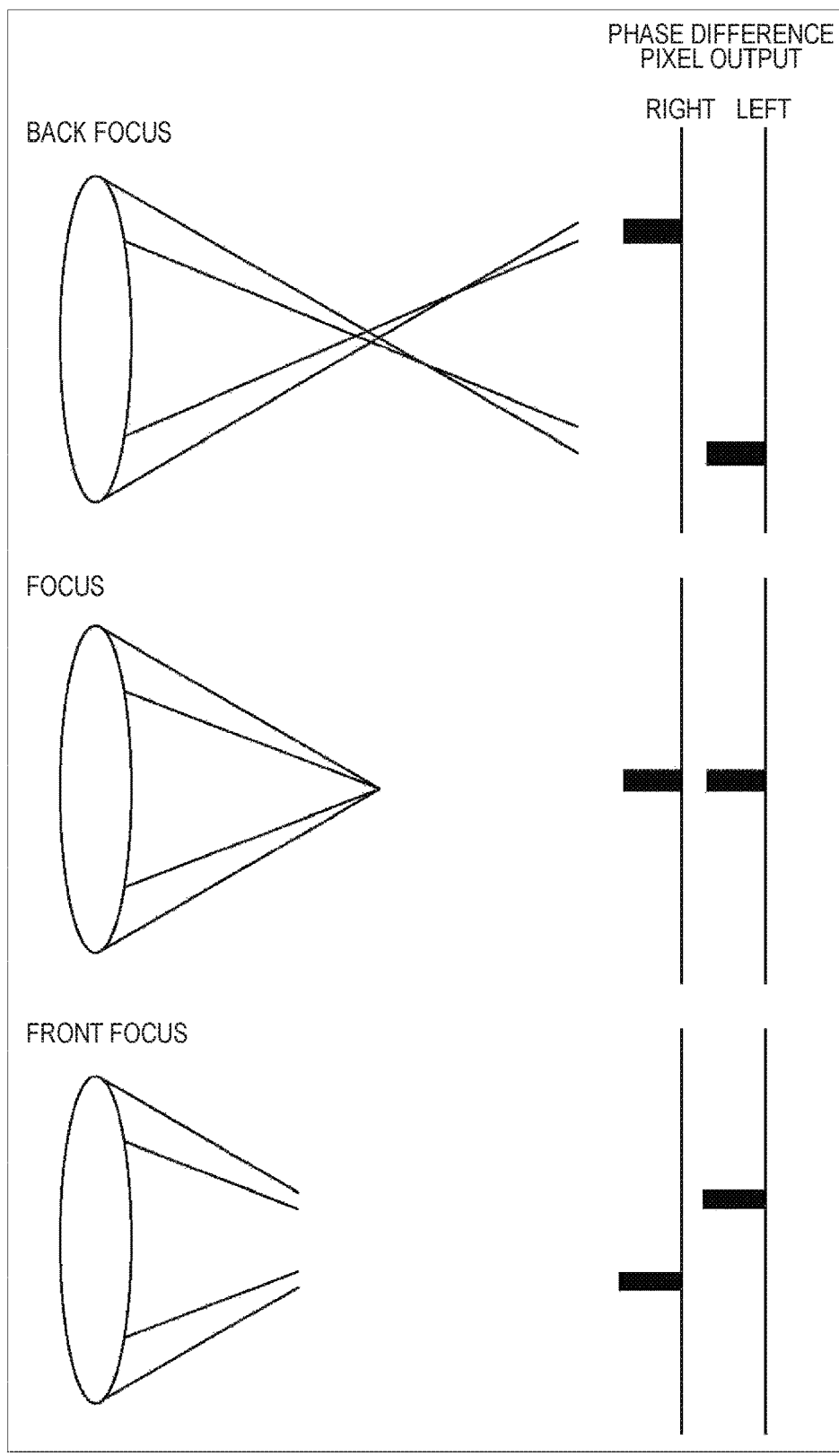
FIG. 5 is a diagram for describing focus detection with a phase difference system.

The presence of the light shield film 216-2 allows the photodiodes to separately receive light from the left part of the lens group 21 and light from the right part of the lens group 21. Receiving light from the left part of the lens group 21 and light from the right part with the photodiodes 214-2 and 214-3 respectively enables detection of a focal location as shown in FIG. 5.

That is, in front or back focus, the output from the photodiode 214-2 does not agree with the output from the photodiode 214-3 (the outputs from a pair of phase difference detection pixels do not agree with each other). In focus, the output from the photodiode 214-2 agrees with the output from the photodiode 214-3 (the outputs from a pair of phase difference detection pixels agree with each other). In the case of front or back focus, focal detection is achieved by moving the lens group 21 to a focus position.

When focus positions are detected with the phase difference system, focal positions can be detected at a relatively high speed to achieve high-speed autofocus. The phase difference system, however, may cause reduced sensitivity and, for example, may make it difficult to detect focal positions in a dark place or the like.

With reference again to FIG. 4, the light shield film 216-2 extends to the central part of the photodiode 214-2. As compared with the photodiode 214-1, the light shield film does not extend to the photodiode. 214-1 but extends to the central part of the photodiode 214-2. As the amount of light incident on the photodiode 214-1 is compared with the amount of light incident on the photodiode 214-2, the amount of light on the photodiode 214-1 is larger than that on the photodiode 214-2.

The sensitivity of the photodiode 214-1 is thus higher than that of the photodiode 214-2. As described above, the sensitivity of the photodiode 214-2 is reduced by the influence of the light shield film 216-2 provided to impart the separation ability. In addition, increasing pixels tends to reduce the size of each pixel, and reduced pixel size may decrease the sensitivity. This may often reduce the sensitivity of the photodiode 214-2. The same applies to the photodiode 214-3 as a phase difference detection pixel.

As compared with ordinary pixels, the sensitivity of the phase difference detection pixel is reduced by light shading to increase the influence of the reduction in pixel size, which may reduce the accuracy of focal position detection. Since reduced pixel size may degrade the separation ability, the absence of the separation ability may fail to achieve focus detection by image-plane phase difference detection.

Figure 6:
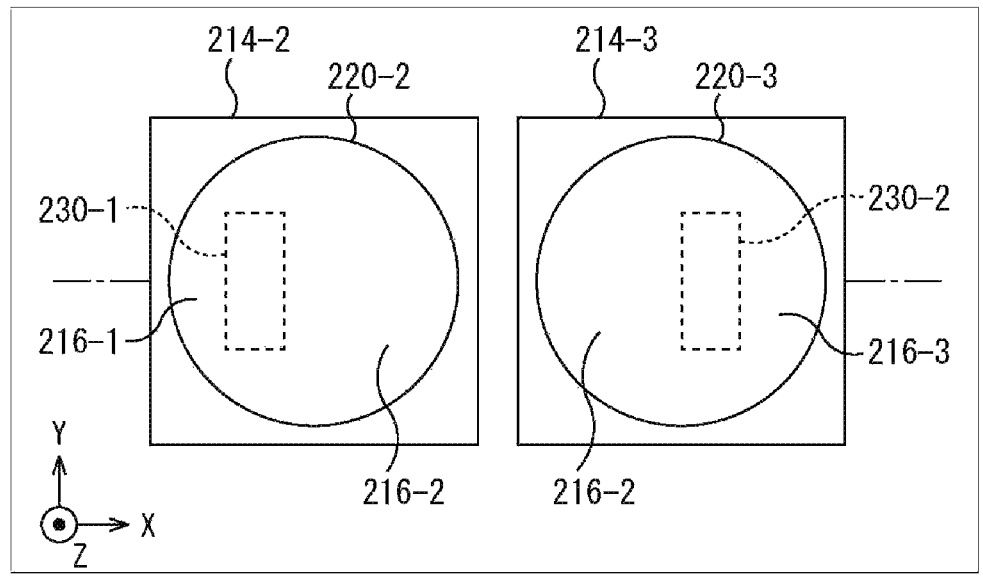
FIG. 6 is a diagram illustrating a configuration of a focus detecting device.

Reference is made to FIG. 6. FIG. 6 is a top plan view of phase difference detection pixels, for example, a top view of the phase difference detection pixels illustrated in FIG. 4. In FIG. 6, a single pixel, shown as a square, represents each of the photodiodes 214 in this description. FIG. 6 illustrates the photodiodes 214-2 and 214-3 of the phase difference detection pixels.

In the following description, the case where the phase difference detection pixels are provided next to each other is described as an example, but the phase difference detection pixels may be provided apart from each other. The present technology described below can be also applied to the case where the phase difference detection pixels are provided apart from each other.

In the plan view shown in FIG. 6, the light shield film 216 is provided above the photodiodes 214-2 and 214-3 except for openings. In the cross-sectional view (side view) of the pixels as shown in FIG. 4, the light shield film 216 appears to be discontinuously provided such that an opening is provided between the light shield film 216-1 and the light shield film 216-2. In the plan view as shown in FIG. 6, the light shield film 216 is continuously provided and partially open as openings.

In this case, an opening formed between the light shield films 216-1 and 216-2 and provided above the photodiode 214-2 is referred to as an opening 230₄ and an opening formed between the light shield films 216-2 and 216-3 and provided above the photodiode 214-3 is referred to as an opening 230-2.

Since the light shield film 216 is provided for the phase difference detection pixels as described above, the sensitivity of the phase difference detection pixels is lower than that of ordinary pixels. To improve the sensitivity of the phase difference detection pixels, the amount of light incident on the photodiodes 214 through the openings 230 needs to be increased. To increase the amount of light incident on (the amount of light received by) the photodiodes 214, the image formation point of light condensed by the microlenses 220 may be controlled by changing, for example, the curvature of the microlenses 220, or the area of the phase difference detection pixels covered by the light shield film 216 and shielded from light may be controlled.

Figure 7:
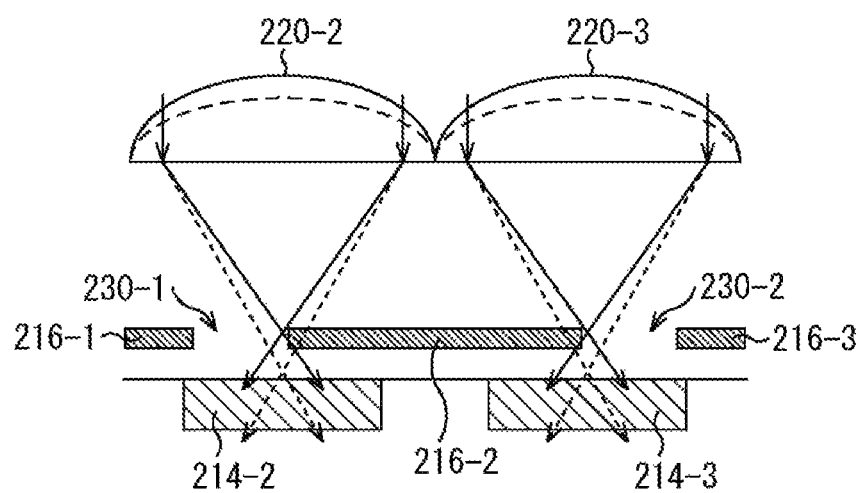
FIG. 7 is a diagram illustrating a configuration of a focus detecting device.
Figure 8:
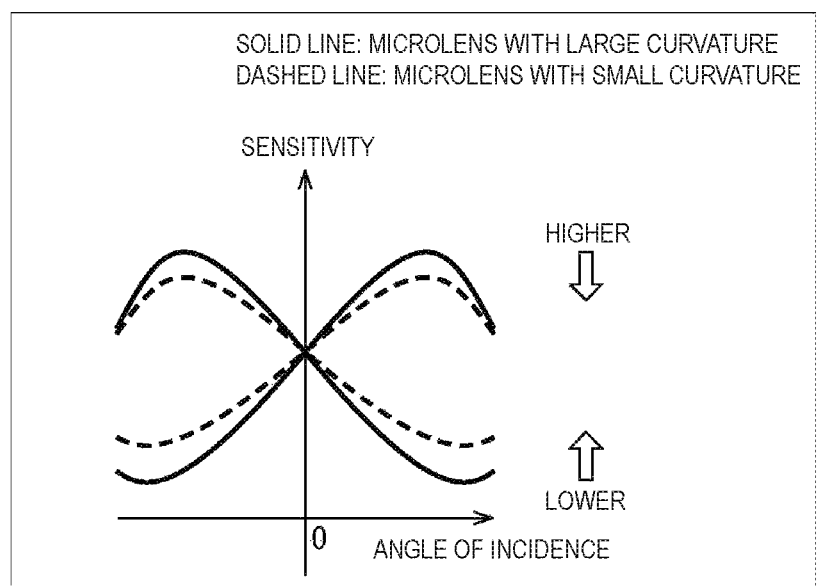
FIG. 8 is a diagram illustrating acceptance angle distribution.

With reference to FIGS. 7 and 8, the case where the image formation point of light condensed by the microlens 220 may be controlled by changing, for example, the curvature of the microlens 220 to increase the amount of light received will be described.

FIG. 7 is a diagram illustrating the phase difference detection pixels extracted from the pixels shown in FIG. 4. The microlenses 220-2 and 220-3 are indicated by the solid lines and dashed lines, where the solid lines represent the shape of the microlenses 220 with a larger curvature and the dashed lines represent the shape of the microlenses 220 with a smaller curvature.

In FIG. 7, the solid arrows represent the path of light incident on the microlenses 220 using the microlenses 220 indicated by the solid lines; and the dashed arrows represent the path of light incident on the microlenses 220 using the microlenses 220 indicated by the dashed lines.

With reference to the solid arrows and dashed arrows shown in FIG. 7, it is found that the solid arrows pass through the openings 230, but some of the dashed arrows are shielded by the light shield film 216-2. This indicates that the amount of light passing through the openings 230 is changed by modifying the curvature of the microlenses 220, which changes the amount of light received by the photodiodes 214.

This is shown as a graph in FIG. 8. The abscissa of the graph shown in FIG. 8 represents the angle of incidence of light, and the ordinate represents the output value of the pixels according to the incident light. In FIG. 8, the solid line graph is a graph showing the photodiodes 214 that receive light from the microlenses 220 having a large curvature and indicated by the solid lines in FIG. 7.

In FIG. 8, the dashed line graph is a graph showing the photodiodes 214 that receive light from the microlenses 220 having a small curvature and indicated by the dashed lines in FIG. 7. In FIG. 8 the left side shows the amount of light received by the photodiode 214-2 illustrated in FIG. 7, and the right side shows the amount of light received by the photodiode 214-3 illustrated in FIG. 7.

FIG. 8 shows that the amount of light received by a phase difference detection pixel reaches the maximum value at an angle of incidence except for 0 degree. That is, the amount of light received by a phase difference detection pixel depends on the angle of incidence of light and reaches the maximum value at a predetermined angle of incidence of light. A phase difference detection pixel, for example the photodiode 214-2, efficiently receives incident light from the right side to provide the maximum value, but fails to receive incident light from the left side to output a small value. Similarly, the photodiode 214-2 efficiently receives incident light from the left side to provide the maximum value, but fails to receive incident light from the right side to output a small value.

In this way, phase difference detection pixels are configured to receive light from a predetermined direction and hardly receive light from the directions other than the predetermined direction.

FIG. 8 shows that the maximum value for the microlenses 220 with a large curvature is larger than that for the microlenses 220 with a smaller curvature and the minimum value is smaller. This indicates that the curvature of the microlenses 220 is increased to increase the maximum value of sensitivity and the curvature of the microlenses 220 is reduced increase the minimum value of sensitivity.

In this way, the sensitivity of phase difference detection pixels can be changed by modifying the curvature of the microlenses 220. Although the curvature of the microlenses 220 is described here as an example, the sensitivity of phase difference detection pixels can be changed by modifying the conditions other than curvature, for example, materials of the microlenses 220.

This suggests that the conditions of the microlenses 220 may be changed, for example, the curvature of the microlenses 220 is increased in order to improve the sensitivity of the phase difference detection pixels. However, when the conditions (e.g., curvature) of only the microlenses 220 for the phase difference detection pixels are modified in the modification of the conditions of the microlenses 220, the continuity of the microlenses 220 for the phase difference detection pixels and for the imaging pixels may deteriorate to degrade mixed colors in imaging pixels in the vicinity of the phase difference detection pixels.

The modification of the conditions for the microlenses 220 for all pixels including phase difference detection pixels and imaging pixels can eliminate a concern about the above continuity deterioration, but often changes the light condensing capability of imaging pixels to vary the properties of the imaging pixels.

When the acceptance angle distribution for the phase difference detection pixels is accordingly controlled by modifying the conditions of the microlenses 220, the properties of the imaging pixels may vary to cause deterioration in image quality or the like.

Figure 9:
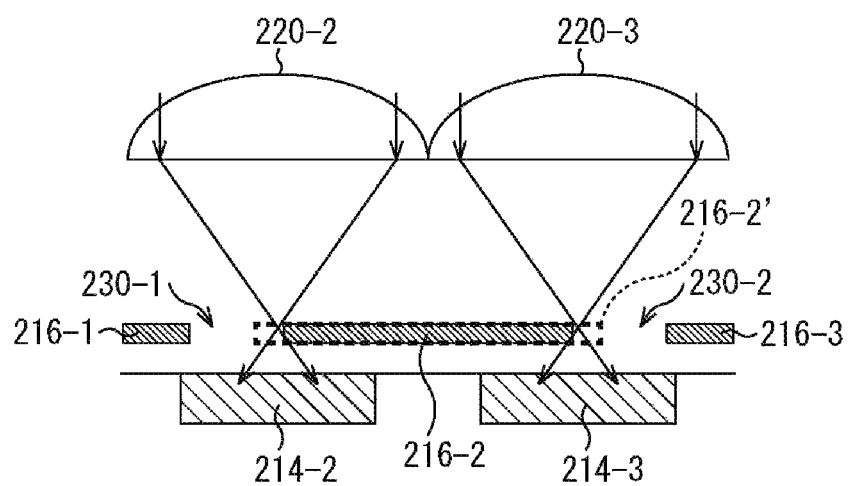
FIG. 9 is a diagram illustrating a configuration of a focus detecting device.
Figure 10:
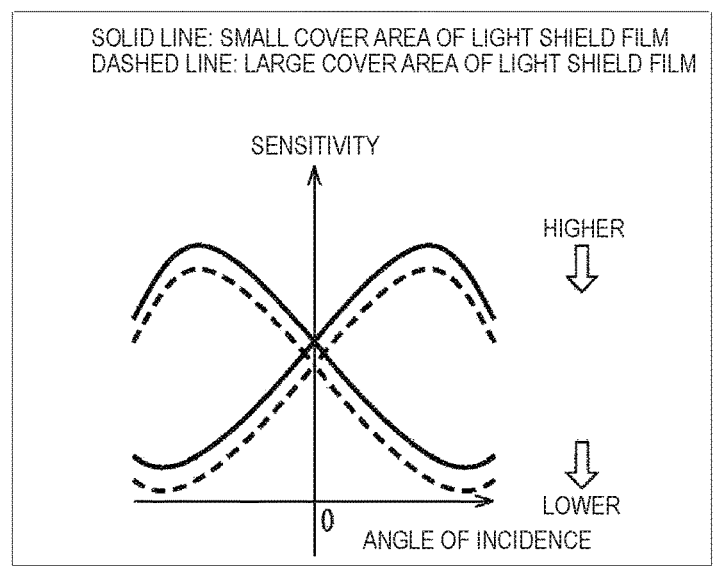
FIG. 10 is a diagram illustrating acceptance angle distribution.

With reference to FIGS. 9 and 10, the case where the amount of light received is increased by controlling the cover area of the light shield film 216 over the microlenses 220, in other words, by controlling the size of the openings 230 will be described.

FIG. 9 is a diagram illustrating the phase difference detection pixels extracted from the pixels shown in FIG. 4. The light shield film 216-2 is indicated by the solid line and the dashed line. The solid line shows the case where the light shield film 216-2 is short and the openings 230 are large; and the dashed line shows the case where the light shield film 216-2 is long and the openings 230 are small.

The case of the light shield film 216-2 indicated by the solid line shown in FIG. 9 is compared with the case of the light shield film 216-2 indicated by the dashed line. In the case of the light shield film 216-2 indicated by the solid line, the openings 230 are large and thus light passing through the microlenses 220 is not shielded by the light shield film 216-2 but received by the photodiodes 214. Although light travels the same pathway, in the case of the light shield film 216-2 indicated by the dashed line, the openings 230 are small and thus light passing through the microlenses 220 is shielded by the light shield film 216-2 and not received by the photodiodes 214.

This shows that the amount of light passing through the openings 230 is modified by changing the length of the light shield film 216; or the size of the openings 230, or the cover area of the light shield film 216 over the microlenses 220, which changes the amount of light received by the photodiodes 214.

This is shown as a graph in FIG. 10. The abscissa of the graph shown in FIG. 10 represents the angle of incidence of light, and the ordinate represents the output value (sensitivity) of the pixels according to the incident light. In FIG. 10, the solid line graph is a graph showing the sensitivity of the photodiodes 214 when the light shield film 216-2 indicated by the solid line in FIG. 9 is short (when the cover area of the light shield film is small). In FIG. 10, the dashed line graph is a graph showing the sensitivity of the photodiodes 214 when the light shield film 216-2 indicated by the dashed line in FIG. 9 is long (when the cover area of the light shield film is large).

In FIG. 10 the left side shows the amount of light received by the photodiode 214-2 illustrated in FIG. 9, and the right side shows the amount of light received by the photodiode 214-3 illustrated in FIG. 9.

FIG. 10 indicates that both the maximum and minimum values of sensitivity in the case where the cover area of the light shield film 216-2 is small and the openings 230 are large are larger than those in the case where the cover area of the light shield film 216-2 is large and the openings 230 are small. This suggests that the cover area of the light shield film 216-2 is reduced and the openings 230 are increased to increase the maximum and minimum values of sensitivity.

In this way, the sensitivity of the phase difference detection pixels can be modified by changing the size of the light shield film 216-2. Although the case of changing the size of the light shield film 216-2 is described here as an example, the sensitivity of the phase difference detection pixels can be modified similarly by changing the size of the light shield film 216-1 or 216-3. That is, the sensitivity of the phase difference detection pixels can be modified depending on the cover area of the light shield film 216 over the photodiodes 214.

However, a small cover area of the light shield film 216, or the large openings 230 may reduce the resolution of the phase difference detection pixels to degrade functions, such as autofocus.

As described with reference to FIGS. 7 to 10, the sensitivity of the phase difference detection pixel can be controlled by adjusting conditions, such as the curvature of the microlenses 220, and the cover area of the light shield film 216. It is, however, difficult to obtain a desired resolution and sensitivity as phase difference detection pixels, as described above.

When the acceptance angle distribution of the phase difference detection pixels is controlled by adjusting conditions, such as the curvature of the microlenses 220 and the cover area of the light shield film 216, the features of the acceptance angle distribution at both higher outputs and lower outputs vary and thus the features at higher outputs and lower outputs are difficult to adjust independently.

If the features of the acceptance angle distribution at higher outputs and lower outputs can be controlled independently, the following effects can be obtained.

That is, for example, when only lower outputs are increased while higher outputs are maintained in the acceptance angle distribution of the phase difference detection pixels without varying the properties of the imaging pixels, the phase difference detection pixels can be also used as imaging pixels while maintaining some phase difference detection properties.

As another effect, when only lower outputs are further decreased while higher outputs are maintained in the acceptance angle distribution of the phase difference detection pixels without varying the properties of the imaging pixels, phase difference detection properties can be improved.

Therefore, description on phase pixels capable of adjusting the features of the acceptance angle distribution at higher outputs and lower outputs independently is added.

<Configuration of Focus Detecting Device According to First Embodiment>

Figure 11:
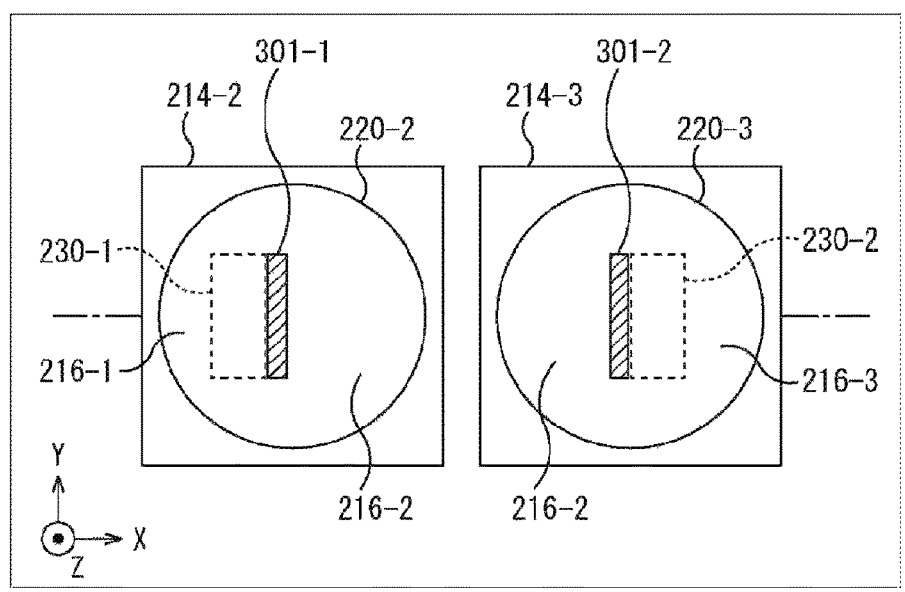
FIG. 11 is a diagram illustrating a configuration of a focus detecting device according to a first embodiment employing the present technology.
Figure 12:
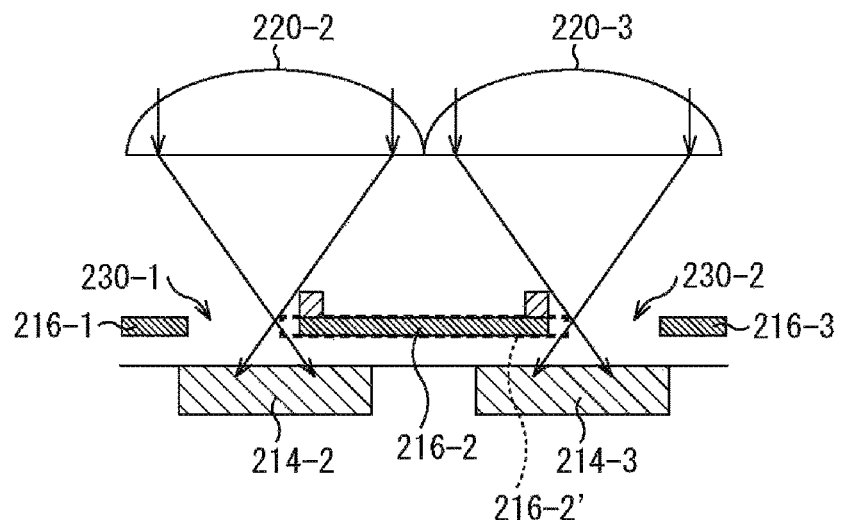
FIG. 12 is a diagram illustrating the configuration of the focus detecting device according to the first embodiment.

FIG. 11 is a top plan view of the phase difference detection pixels in a focus detecting device according to a first embodiment, and FIG. 12 is a side sectional view. In the phase difference detection pixels in the focus detecting device shown in FIGS. 11 and 12, the same reference numerals are given to the same parts as in the phase difference detection pixels in the focus detecting device shown in FIGS. 6, 7, and 9, and the description on the same parts is appropriately omitted.

The phase difference detection pixels shown in FIG. 11 further include light shield walls 301 in the phase difference detection pixels shown in FIG. 6. The light shield walls 301 are light shield films vertically provided as shown in FIG. 12. In the following description, a light shield member horizontally disposed in the phase difference detection pixels is referred to as a light shield film, and a light shield member vertically disposed is referred to as a light shield wall. The direction of the light shield film 216-2 (the right-left direction in the drawing) is taken as a horizontal direction, and the direction of the light shield walls 301 (the up-down direction in the drawing) is taken as a horizontal direction.

A light shield wall 301-1 is provided on the upper surface of the light shield film 216-2 facing the microlenses 220, and a light shield wall 301-2 is provided on the upper surface of the light shield film 216-2 facing the microlenses 220. The light shield walls 301-1 and 301-2 are located at the ends of the light shield film 216-2 and provided to have a predetermined vertical height to the light shield film 216-2. The light shield walls 301 are provided next to the openings 230.

The description is continued here provided that the light shield walls 301 are provided on the light shield film 216-2, but the light shield walls 301 may be also provided on the light shield film 216-1 and/or the light shield film 216-3.

In the phase difference detection pixels shown in FIG. 12, the light shield film 216-2 is indicated by the solid line and the dashed line. The solid line represents the light shield film 216-2 provided with the light shield walls 301. The dashed line represents the light shield film 216-2' with no light shield wall 301, where the light shield film 216-2' has the same length as the light shield film 216-2 shown in FIG. 7 or the like. The light shield film 216-2' is illustrative only for comparison and is not provided for a component necessary for the phase difference detection pixels illustrated in FIG. 12.

In the description on second to eighth embodiments described below, the parts indicated by the dashed line are illustrated for the purpose of explanation and is not illustrated as necessary components.

In the phase difference detection pixels shown in FIG. 12, the light shield film 216-2 is shorter than the light shield film 216-2' known in the art, and the light shield walls 301 having a predetermined height are provided at the ends of the surface of the light shield film 216-2 facing the microlenses 220.

In the phase difference detection pixels shown in FIG. 12, a small cover area of the light shield film 216-2 results in large openings 230, providing the effects obtained by the large openings 230.

Providing the light shield walls 301 on the upper surface of the light shield film 216-2 can give the same advantages as when the cover area is large like the light shield film 216-2'.

Figure 13:
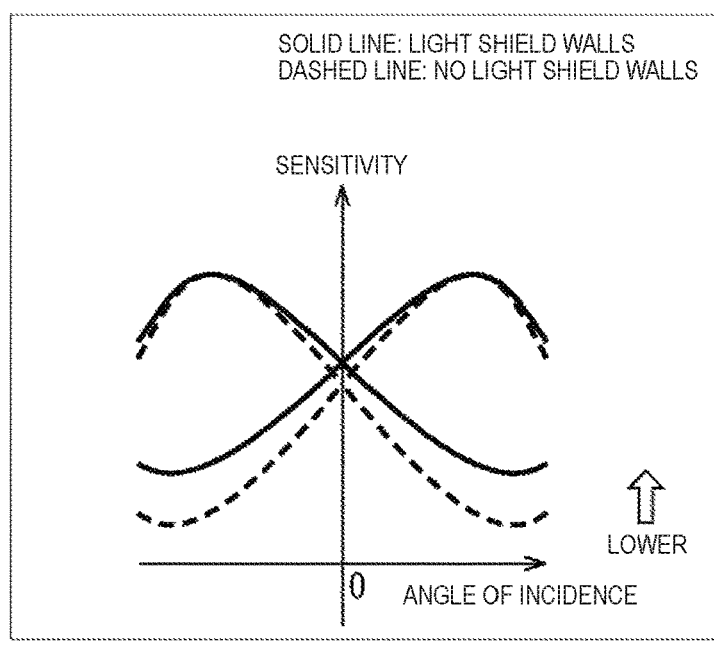
FIG. 13 is a diagram illustrating acceptance angle distribution according to the first embodiment.

This is shown as a graph in FIG. 13. The abscissa of the graph shown in FIG. 13 represents the angle of incidence of light, and the ordinate represents the output value (sensitivity) of the pixels according to the incident light.

In FIG. 13, the solid line graph is a graph showing the sensitivity of the photodiodes 214 in the phase difference detection pixels provided with the light shield walls 301 for the light shield film 216-2 indicated by the solid line in FIG. 12. In FIG. 13, the dashed line graph is a graph showing the sensitivity of the photodiodes 214 in the phase difference detection pixels without the light shield walls 301 for the light shield film 216-2' indicated by the dashed line in FIG. 12.

FIG. 13 indicates that the minimum value of sensitivity can be increased by providing the light shield walls 301 without significantly changing the maximum value of sensitivity. In other words, providing the light shield walls 301 for the phase difference detection pixels can increase only lower outputs while maintain higher outputs in the acceptance angle distribution.

Figure 14:
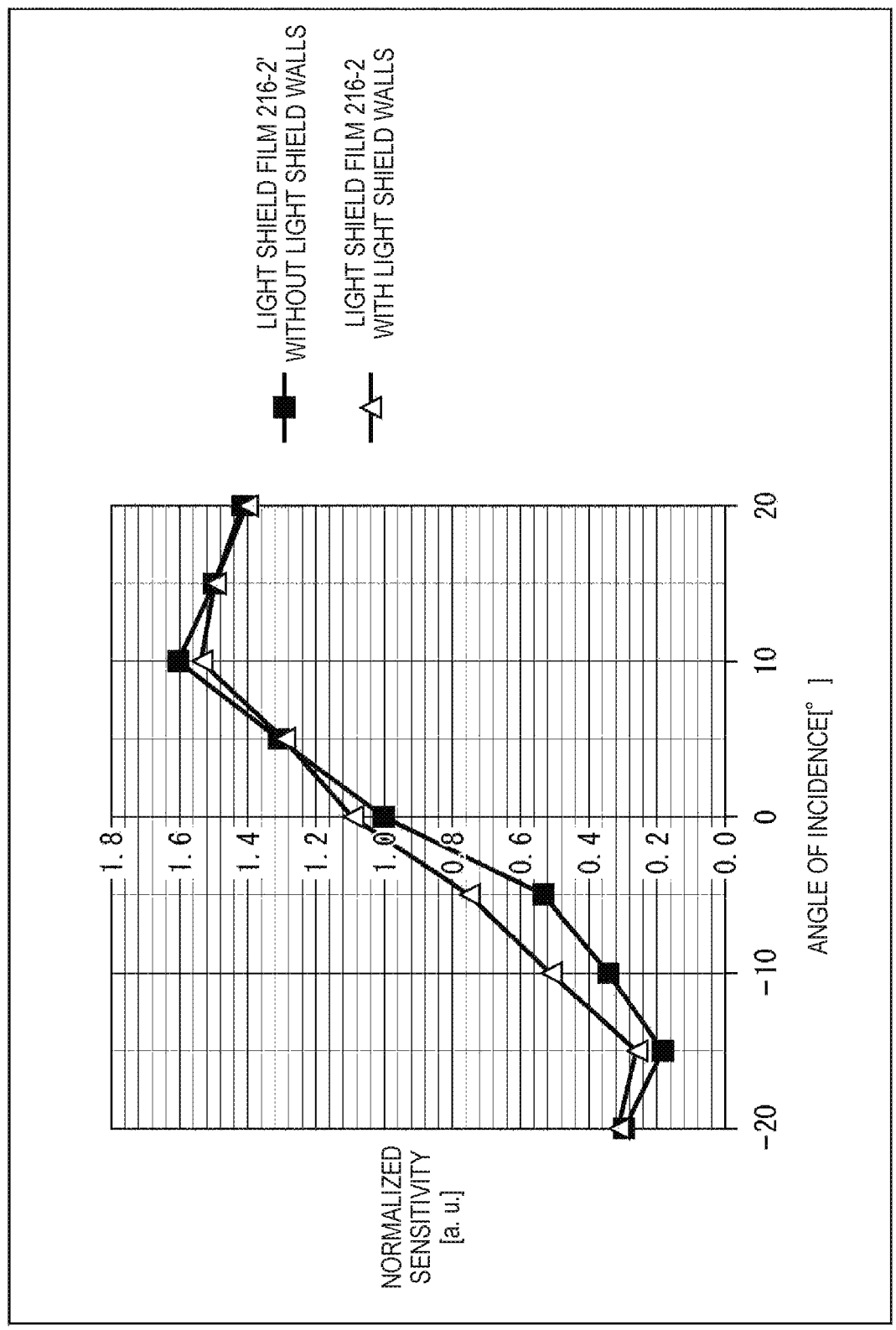
FIG. 14 is a diagram illustrating acceptance angle distribution according to the first embodiment.

The applicants have simulated the acceptance angle distribution for the phase difference detection pixels provided with the light shield walls 301 as shown in FIG. 12. The results are shown in FIG. 14. As in the graph shown in FIG. 13, the abscissa of the graph shown in FIG. 14 represents the angle of incidence of light, and the ordinate represents the output value (sensitivity) of the pixels according to the incident light.

In FIG. 14, the graph marked by triangles represents the sensitivity of the photodiodes 214 which are phase difference detection pixels having the light shield walls 301; and the graph marked by squares represents the sensitivity of the photodiodes 214 in the phase difference detection pixels without the light shield walls 301 for the light shield film 216-2'.

The graph in FIG. 14 also shows that lower outputs are increased while higher outputs are maintained in the acceptance angle distribution.

Since the properties of the phase difference detection pixels are similar to those of the imaging pixels in that lower outputs are increased while higher outputs are maintained in the acceptance angle distribution, phase difference detection pixels can be used as imaging pixels. Although not shown, the acceptance angle distribution of image capturing pixels has the maximum value at an angle of 0 degree, and the difference in sensitivity between the maximum value and the minimum value is small.

Since the difference in sensitivity between the maximum value and the minimum value is reduced by maintaining higher outputs and increasing lower outputs in the acceptance angle distribution to provide properties similar to those of imaging elements, phase difference detection pixels can be used as imaging pixels. In addition, formation of light shield walls on a light shield film for the phase difference detection pixels does not change the structure of the imaging pixels and thus does not affect the properties of the image capturing pixels, enabling the above adjustment of the properties of the phase difference detection pixels.

In this way, the incident light at higher outputs in the acceptance angle distribution can be controlled by the light shield walls 301, and the incident light at lower outputs can be controlled by the light shield film 216. This allows individual control of higher outputs and lower outputs of sensitivity.

The light shield walls 301 have a rectangle shape as shown in FIG. 12 and are provided at the ends of the surface of the light shield film 216-2 as described above. The shape and position of the light shield walls 301 are not limited to the shape and position shown in FIG. 12.

Figure 15:
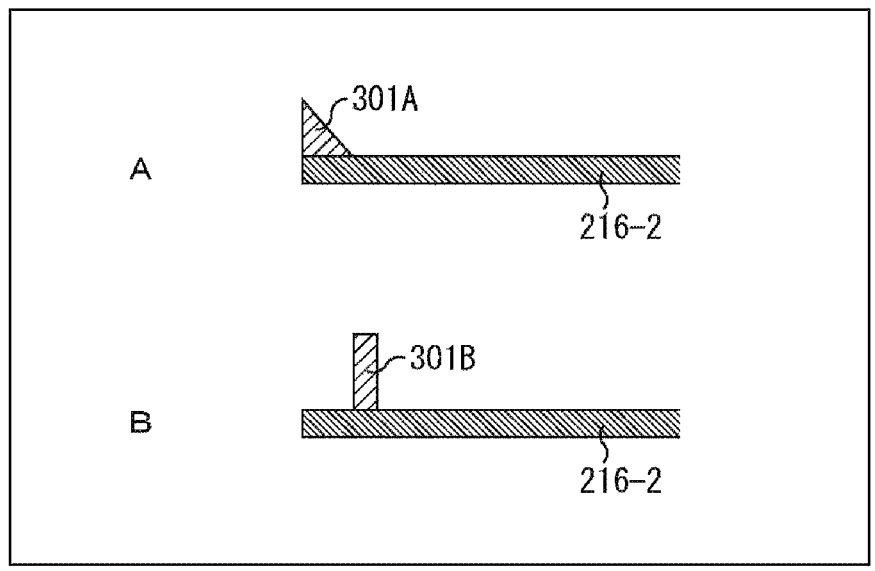
FIG. 15 is a diagram for describing other shapes of a light shield wall.

FIG. 15 illustrates another example of the light shield wall 301. The example shown in FIG. 15A represents a light shield wall 301A in which the cross-section of the light shield wall 301 has a triangular shape. Those having a shape partially having a predetermined height, such as the light shield wall 301A, can be used as a light shield wall.

In the example shown in FIG. 15B, the light shield wall 301 is not provided at the end of the light shield film 216-2 but a light shield wall 301B is disposed at a small distance from the end of the upper surface of the light shield film 216. Like the light shield wall 301B, like the light shield wall 301B, the light shield wall 301B may be provided at any position on the light shield film 216, and the sensitivity can be adjusted by the position and height of the light shield wall 301B.

The shape and position of the light shield walls 301 are accordingly involved in the adjustment of sensitivity and may be any shape and position that provide a desired sensitivity. In second to eighth embodiments, the shape and position of the light shield walls may be also any shape and position that provide a desired sensitivity as in the first embodiment, although the description is omitted.

<Configuration of Focus Detecting Device According to Second Embodiment>

Figure 16:
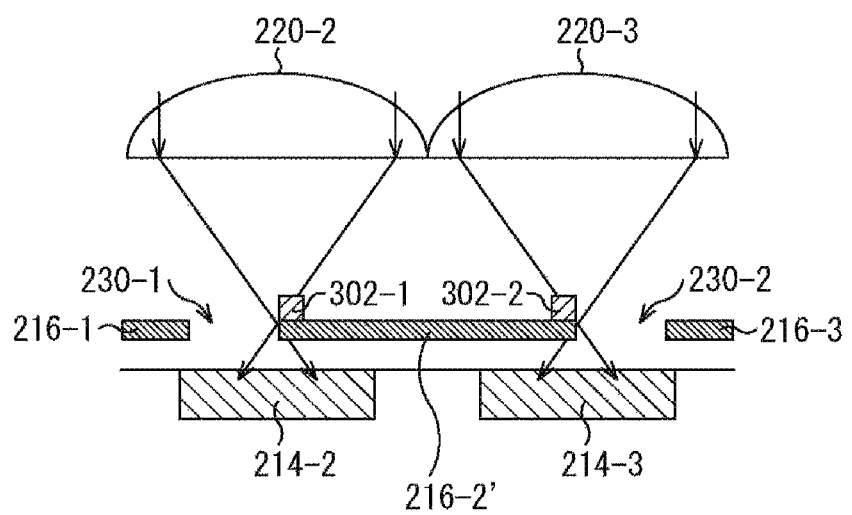
FIG. 16 is a diagram illustrating the configuration of the focus detecting device according to the second embodiment.

FIG. 16 is a side sectional view of phase difference detection pixels in a focus detecting device according to a second embodiment. In the phase difference detection pixels in the focus detecting device shown in FIG. 16, the same reference numerals are given to the same parts as in the phase difference detection pixels in the focus detecting device shown in FIG. 12, and the description on the same parts is appropriately omitted.

In the phase difference detection pixels shown in FIG. 16, the light shield walls 302 are provided on the light shield film 216-2'. A light shield wall 302-1 is provided on the upper surface of the light shield film 216-2' closer to the microlens 220-2, and a light shield wall 302-2 is provided on the upper surface of the light shield film 216-2 closer to the microlens 220-3.

The light shield walls 302-1 and 302-2 are located at the ends of the light shield film 216-2' and provided to have a predetermined vertical height to the light shield film 216-2'. The light shield walls 302 are provided next to the openings 230.

The description is continued here provided that the light shield walls 302 are provided on the light shield film 216-2', but the light shield walls 302 may be also provided on the light shield film 216-1 and/or the light shield film 216-3.

The phase difference detection pixels shown in FIG. 16 have the same configuration as the phase difference detection pixels shown in FIG. 12 except that the light shield film 216-2 has a different length. The light shield film 216-2' for the phase difference detection pixels shown in FIG. 16 is longer than the light shield film 216-2 shown in FIG. 12. In other words, the light shield film 216-2' for the phase difference detection pixels shown in FIG. 16 has the same length as the light shield film 216-2 in FIG. 7.

In the phase difference detection pixels shown in FIG. 16, a large cover area of the light shield film 216-2 results in small openings 230, providing the effects obtained by the small openings 230, for example, the effect of improving the resolution.

Figure 17:
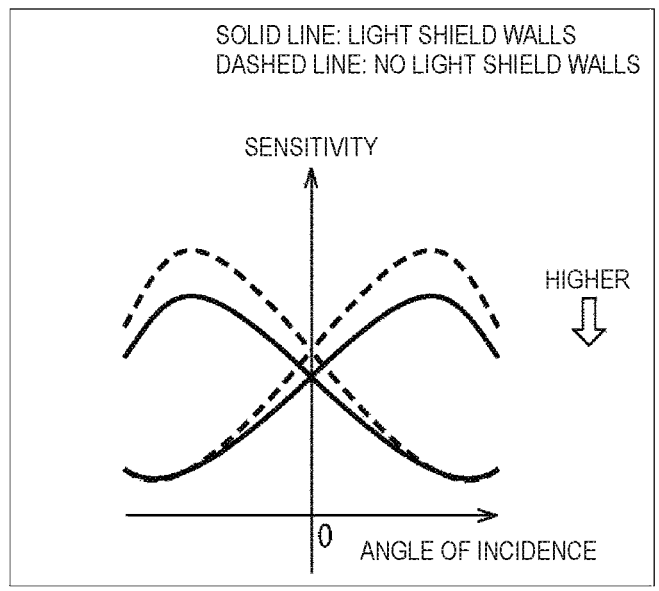
FIG. 17 is a diagram illustrating acceptance angle distribution according to the second embodiment.

The acceptance angle distribution obtained from the phase difference detection pixels having such a configuration is shown in FIG. 17. The abscissa of the graph shown in FIG. 17 represents the angle of incidence of light, and the ordinate represents the output value (sensitivity) of the pixels according to the incident light.

The solid line graph in FIG. 17 represents the sensitivity of the photodiodes 214 in the phase difference detection pixels provided with the light shield walls 302. The dashed line graph in FIG. 17 represents the sensitivity of the photodiodes 214 in the phase difference detection pixels with no light shield wall 302.

FIG. 17 shows that the maximum value of sensitivity can be decreased by providing the light shield walls 302 without significantly changing the minimum value of sensitivity. In other words, providing the light shield walls 302 for the phase difference detection pixels without changing the length of the light shield film 216 can decrease only higher outputs while maintain lower outputs in the acceptance angle distribution.

In this way, the incident light can be controlled by the light shield walls 302 for higher outputs in the acceptance angle distribution, and the incident light can be controlled by the light shield film 216 for lower outputs. This allows individual control of higher outputs and lower outputs of sensitivity. In addition, formation of light shield walls on a light shield film for the phase difference detection pixels does not change the structure of the imaging pixels and thus does not affect the properties of the image capturing pixels, enabling the above adjustment of the properties of the phase difference detection pixels.

<Configuration of Focus Detecting Device According to Third Embodiment>

Figure 18:
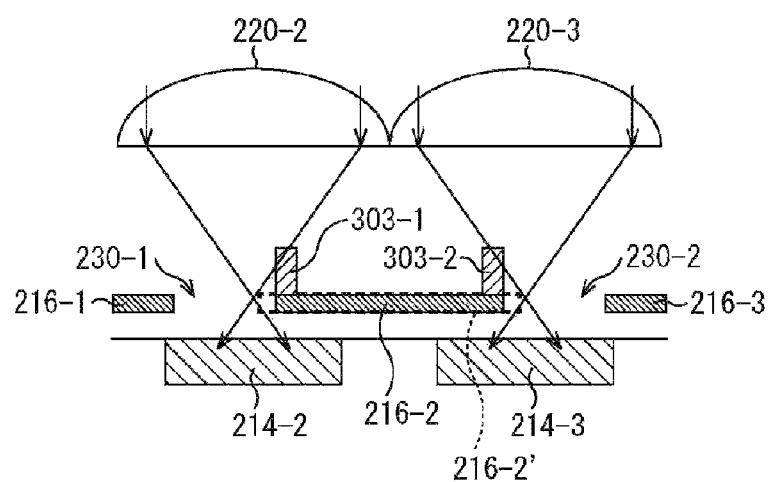
FIG. 18 is a diagram illustrating the configuration of the focus detecting device according to the third embodiment.

FIG. 18 is a side sectional view of phase difference detection pixels in a focus detecting device according to a third embodiment. In the phase difference detection pixels in the focus detecting device shown in FIG. 18, the same reference numerals are given to the same parts as in the phase difference detection pixels in the focus detecting device shown in FIG. 12, and the description on the same parts is appropriately omitted.

The phase difference detection pixels shown in FIG. 18 have the same configuration as the phase difference detection pixels shown in FIG. 12 except that the light shield walls 303 have a different height. That is, the phase difference detection pixels shown in FIG. 18 are the same as the phase difference detection pixels shown in FIG. 12 except that the light shield walls 303 are provided on the light shield film 216-2. The light shield wall 303-1 is provided on the upper surface of the light shield film 216-2 closer to the microlens 220-2, and the light shield wall 303-2 is provided on the upper surface of the light shield film 216-2 closer to the microlens 220-3.

The light shield walls 303-1 and 303-2 are located at the ends of the light shield film 216-2 and provided to have a predetermined vertical height to the light shield film 216-2. The light shield walls 303-1 and 303-2 are higher than the light shield walls 301 shown in FIG. 12. The light shield walls 303 are provided next to the openings 230.

The description is continued here provided that the light shield walls 303 are provided on the light shield film 216-2, but the light shield walls 303 may be also provided on the light shield film 216-1 and/or the light shield film 216-3.

In this way, in the phase difference detection pixels shown in FIG. 18, the light shield film 216-2 is shorter than the light shield film 216-2' known in the art, and the light shield walls 303 having a predetermined height are provided at the ends of the surface of the light shield film 216-2 facing the microlenses 220.

In the phase difference detection pixels shown in FIG. 18, a small cover area of the light shield film 216-2 results in large openings 230, providing the effects obtained by the large openings 230. Providing the light shield walls 303 on the upper surface of the light shield film 216-2 and increasing the height of the light shield walls 303 can give the same advantages as when the cover area is large like the light shield film 216-2'.

Figure 19:
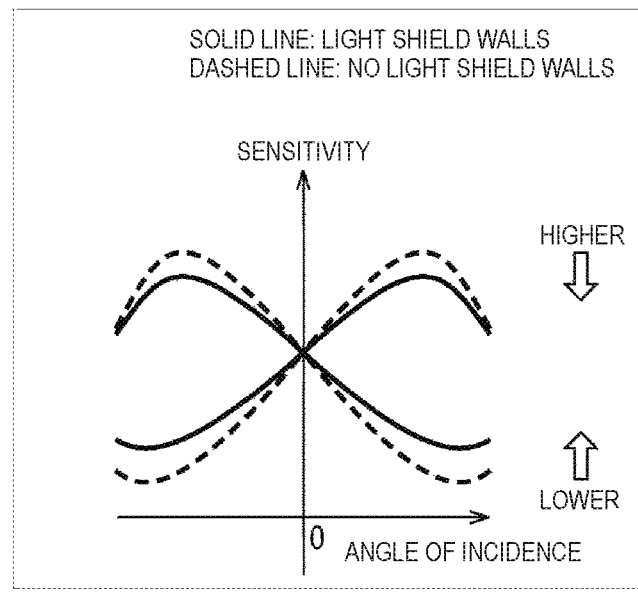
FIG. 19 is a diagram illustrating acceptance angle distribution according to the third embodiment.

This is shown as a graph in FIG. 19. The abscissa of the graph shown in FIG. 19 represents the angle of incidence of light, and the ordinate represents the output value (sensitivity) of the pixels according to the incident light.

In FIG. 19, the solid line graph is a graph showing the sensitivity of the photodiodes 214 in the phase difference detection pixels provided with the light shield walls 303 for the light shield film 216-2 indicated by the solid line in FIG. 18. In FIG. 19, the dashed line graph is a graph showing the sensitivity of the photodiodes 214 in the phase difference detection pixels without the light shield walls 303 for the light shield film 216-2' indicated by the dashed line in FIG. 18.

FIG. 19 shows that providing the light shield walls 303 can decrease the maximum value of sensitivity and increase the minimum value of sensitivity. In other words, providing the light shield walls 303 for the phase difference detection pixels can decrease higher outputs can be decreased and increase lower outputs in the acceptance angle distribution.

As described above, higher outputs and lower outputs can be controlled to obtain desired outputs by adjusting the length of the light shield film 216 (the cover area of the light shield film 216 over the photodiodes 214), providing the light shield walls 301 to 303 on the surface of the light shield film 216 facing the microlenses 220 and adjusting the height of the light shield walls 301 to 303. In addition, formation of light shield walls on a light shield film for the phase difference detection pixels does not change the structure of the imaging pixels and thus does not affect the properties of the image capturing pixels, enabling the above adjustment of the properties of the phase difference detection pixels.

<Configuration of Focus Detecting Device According to Fourth Embodiment>

Figure 20:
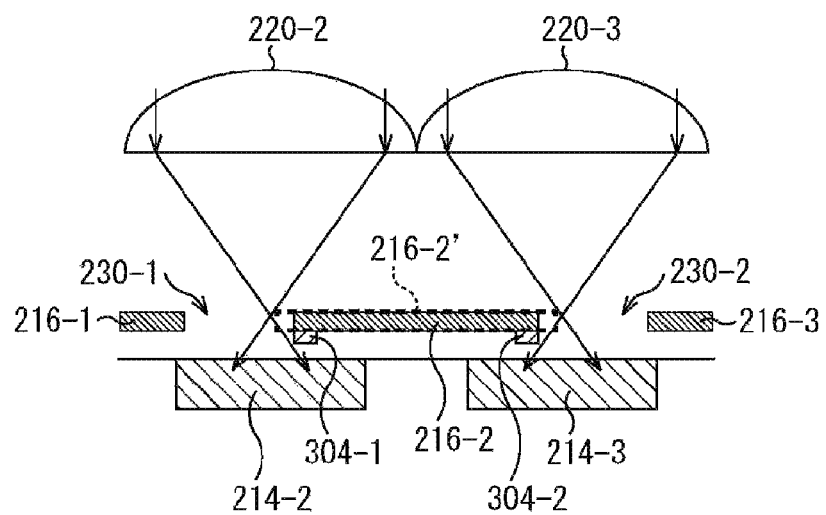
FIG. 20 is a diagram illustrating the configuration of the focus detecting device according to the fourth embodiment.

FIG. 20 is a side sectional view of phase difference detection pixels in a focus detecting device according to a fourth embodiment. In the phase difference detection pixels in the focus detecting device shown in FIG. 20, the same reference numerals are given to the same parts as in the phase difference detection pixels in the focus detecting device shown in FIG. 12, and the description on the same parts is appropriately omitted.

The phase difference detection pixels shown in FIG. 20 have the same configuration as the phase difference detection pixels shown in FIG. 12 except that the light shield walls 301, which are provided on the upper surface of the light shield film 216-2 for the phase difference detection pixels shown in FIG. 12, are provided on the lower surface. That is, a light shield wall 304-1 is provided on the lower surface of the light shield film 214-2 closer to the photodiode 214-2, and a light shield wall 304-2 is provided on the lower surface of the light shield film 216-2 closer to the photodiode 214-3.

The light shield walls 304-1 and 304-2 are located at the ends of the light shield film 216-2 and provided to have a predetermined vertical height to the light shield film 216-2. The light shield walls 304 are provided next to the openings 230.

The description is continued here provided that the light shield walls 304 are provided on the lower surface of the light shield film 216-2, but the light shield walls 304 may be also provided on the light shield film 216-1 and/or the light shield film 216-3.

In the phase difference detection pixels shown in FIG. 20, the light shield film 216-2 is indicated by the solid line and the dashed line. The solid line represents the light shield film 216-2 provided with the light shield walls 304. The dashed line represents the light shield film 216-2' with no light shield wall 304, where the light shield film 216-2' has the same length as the light shield film 216-2 shown in FIG. 7 or the like. The light shield film 216-2' is illustrative only for comparison and is not provided for a component necessary for the phase difference detection pixels illustrated in FIG. 20.

In the phase difference detection pixels shown in FIG. 20, the light shield film 216-2 is shorter than the light shield film 216-2' known in the art, and the light shield walls 304 having a predetermined height are provided at the ends of the surface of the light shield film 216-2 facing the photodiodes 214.

In the phase difference detection pixels shown in FIG. 20, a small cover area of the light shield film 216-2 results in large openings 230, providing the effects obtained by the large openings 230.

Figure 21:
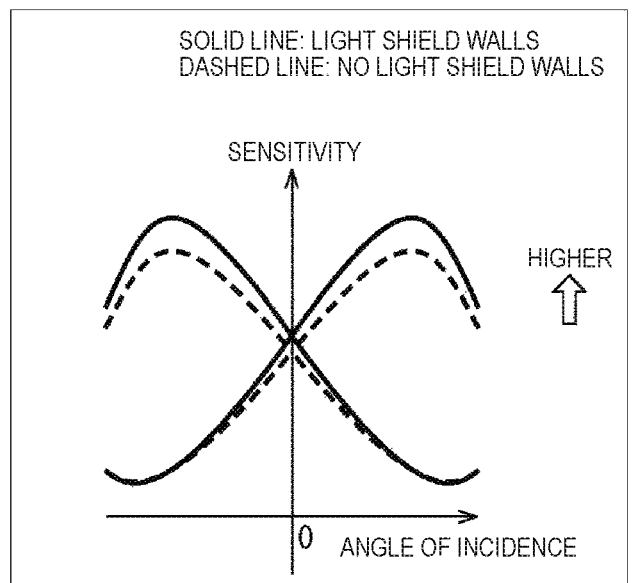
FIG. 21 is a diagram illustrating acceptance angle distribution according to the fourth embodiment.

This is shown as a graph in FIG. 21. The abscissa of the graph shown in FIG. 21 represents the angle of incidence of light, and the ordinate represents the output value (sensitivity) of the pixels according to the incident light.

In FIG. 21, the solid line graph is a graph showing the sensitivity of the photodiodes 214 in the phase difference detection pixels provided with the light shield walls 304 for the light shield film 216-2 indicated by the solid line in FIG. 20. In FIG. 21, the dashed line graph is a graph showing the sensitivity of the photodiodes 214 in the phase difference detection pixels without the light shield walls 304 for the light shield film 216-2' indicated by the dashed line in FIG. 20.

FIG. 21 shows that the maximum value of sensitivity can be increased by providing the light shield walls 304 without significantly changing the minimum value of sensitivity. In other words, providing the light shield walls 304 for the phase difference detection pixels can increase only higher outputs while maintain lower outputs in the acceptance angle distribution.

The phase difference detection pixels from which lower outputs are maintained and higher outputs are increased in the acceptance angle distribution functions as phase difference detection pixels having high resolution. In addition, formation of light shield walls on a light shield film for the phase difference detection pixels does not change the structure of the imaging pixels and thus does not affect the properties of the image capturing pixels, enabling the above adjustment of the properties of the phase difference detection pixels.

The shape and position of the light shield walls 304 are accordingly involved in the adjustment of sensitivity and may be any shape and position that provide a desired sensitivity.

<Configuration of Focus Detecting Device According to Fifth Embodiment>

Figure 22:
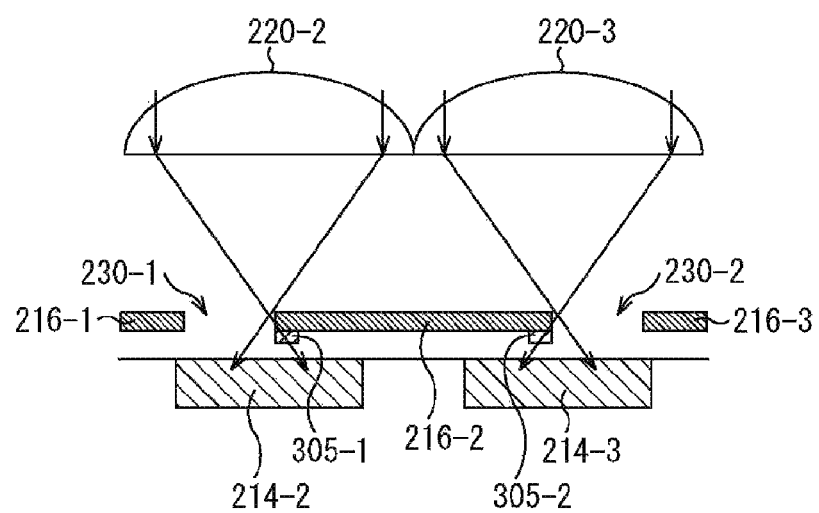
FIG. 22 is a diagram illustrating the configuration of the focus detecting device according to the fifth embodiment.

FIG. 22 is a side sectional view of phase difference detection pixels in a focus detecting device according to a fifth embodiment. In the phase difference detection pixels in the focus detecting device shown in FIG. 22, the same reference numerals are given to the same parts as in the phase difference detection pixels in the focus detecting device shown in FIG. 20, and the description on the same parts is appropriately omitted.

In the phase difference detection pixels shown in FIG. 22, the light shield walls 305 are provided on the lower surface of the light shield film 216-2'. The light shield wall 305-1 is provided on the lower surface of the light shield film 216-2' closer to the photodiode 214-2, and the light shield wall 305-2 is provided on the lower surface of the light shield film 216-2 closer to the photodiode 214-3.

The light shield walls 305-1 and 305-2 are located at the ends of the light shield film 216-2' and provided to have a predetermined vertical height to the light shield film 216-2'. The light shield walls 305 are provided next to the openings 230.

The description is continued here provided that the light shield walls 305 are provided on the lower surface of the light shield film 216-2', but the light shield walls 305 may be also provided on the light shield film 216-1 and/or the light shield film 216-3.

The phase difference detection pixels shown in FIG. 22 have the same configuration as the phase difference detection pixels shown in FIG. 20 except that the light shield film 216-2 has a different length. The light shield film 216-2' for the phase difference detection pixels shown in FIG. 22 is longer than the light shield film 216-2 shown in FIG. 20. In other words, the light shield film 216-2' for the phase difference detection pixels shown in FIG. 22 has the same length as the light shield film 216-2 in FIG. 7.

In the phase difference detection pixels shown in FIG. 22, a large cover area of the light shield film 216-2 results in small openings 230, providing the effects obtained by the small openings 230, for example, the effect of improving the resolution.

Figure 23:
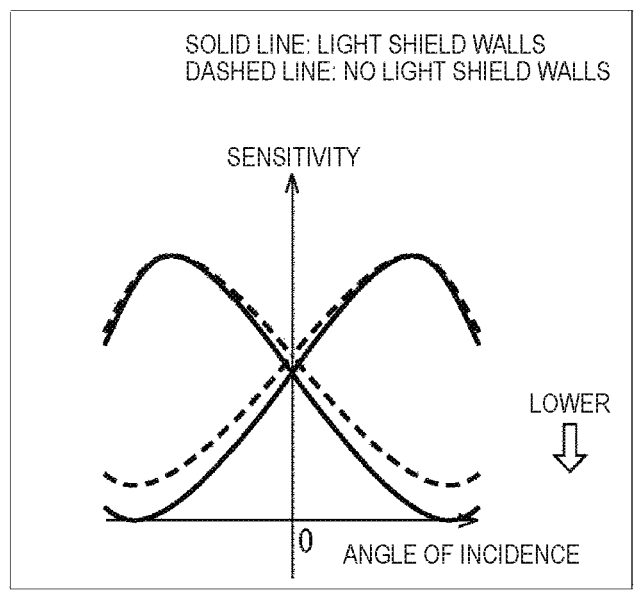
FIG. 23 is a diagram illustrating acceptance angle distribution according to the fifth embodiment.

The acceptance angle distribution obtained from the phase difference detection pixels having such a configuration is shown in FIG. 23. The abscissa of the graph shown in FIG. 23 represents the angle of incidence of light, and the ordinate represents the output value (sensitivity) of the pixels according to the incident light.

The solid line graph in FIG. 23 represents the sensitivity of the photodiodes 214 in the phase difference detection pixels provided with the light shield walls 305. The dashed line graph in FIG. 23 represents the sensitivity of the photodiodes 214 in the phase difference detection pixels with no light shield wall 305.

FIG. 23 shows that the minimum value of sensitivity can be decreased by providing the light shield walls 305 without significantly changing the maximum value of sensitivity. In other words, providing the light shield walls 305 for the phase difference detection pixels without changing the length of the light shield film 216 can decrease only lower outputs while maintaining higher outputs in the acceptance angle distribution. This can improve the resolution as phase difference detection pixels.

In this way, the incident light can be controlled by the light shield walls 305 for higher outputs in the acceptance angle distribution, and the incident light can be controlled by the light shield film 216 for lower outputs. This allows individual control of higher outputs and lower outputs of sensitivity. In addition, formation of light shield walls on a light shield film for the phase difference detection pixels does not change the structure of the imaging pixels and thus does not affect the properties of the image capturing pixels, enabling the above adjustment of the properties of the phase difference detection pixels.

<Configuration of Focus Detecting Device According to Sixth Embodiment>

Figure 24:
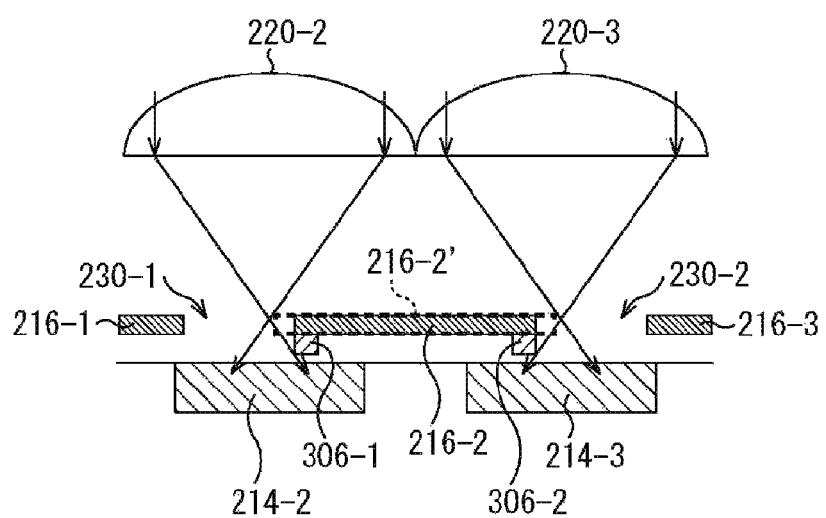
FIG. 24 is a diagram illustrating the configuration of the focus detecting device according to the sixth embodiment.

FIG. 24 is a side sectional view of phase difference detection pixels in a focus detecting device according to a sixth embodiment. In the phase difference detection pixels in the focus detecting device shown in FIG. 24, the same reference numerals are given to the same parts as in the phase difference detection pixels in the focus detecting device shown in FIG. 20, and the description on the same parts is appropriately omitted.

The phase difference detection pixels shown in FIG. 24 have the same configuration as the phase difference detection pixels shown in FIG. 20 except that the light shield walls 306 have a different height. That is, the phase difference detection pixels shown in FIG. 24 have the light shield walls 306 on the lower surface of the light shield film 216-2 in the same manner as the phase difference detection pixels shown in FIG. 20. The light shield wall 306-1 is provided on the lower surface of the light shield film 216-2 closer to the photodiode 214-2, and the light shield wall 306-2 is provided on the lower surface of the light shield film 216-2 closer to the photodiode 214-3.

The light shield walls 306-1 and 306-2 are located at the ends of the light shield film 216-2 and provided to have a predetermined vertical height to the light shield film 216-2. The light shield walls 303-1 and 303-2 are higher than the light shield walls 304 shown in FIG. 20. The light shield walls 306 are provided next to the openings 230.

The description is continued here provided that the light shield walls 306 are provided on the lower surface of the light shield film 216-2, but the light shield walls 306 may be also provided on the light shield film 216-1 and/or the light shield film 216-3.

In this way, in the phase difference detection pixels shown in FIG. 24, the light shield film 216-2 is shorter than the light shield film 216-2' known in the art, and the light shield walls 306 having a predetermined height are provided at the ends of the surface of the light shield film 216-2 facing the photodiodes 214.

In the phase difference detection pixels shown in FIG. 24, a small cover area of the light shield film 216-2 results in large openings 230, providing the effects obtained by the large openings 230. Providing the light shield walls 306 on the lower surface of the light shield film 216-2 and increasing the height of the light shield walls 303 can give the same advantages as when the cover area is large like the light shield film 216-2'.

Figure 25:
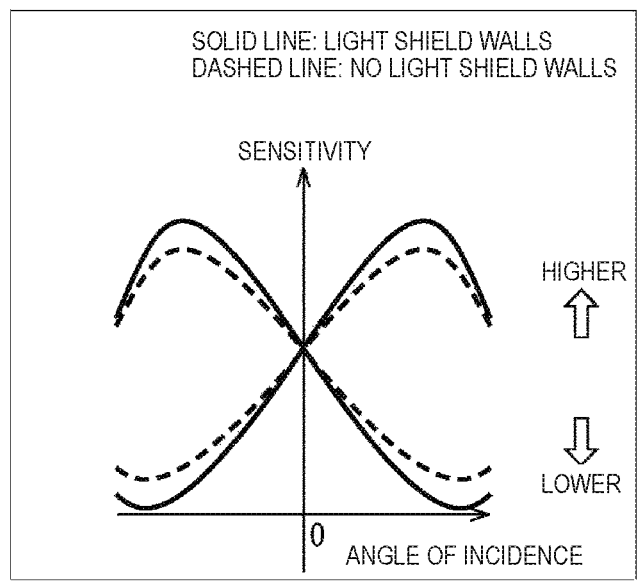
FIG. 25 is a diagram illustrating acceptance angle distribution according to the sixth embodiment.

This is shown as a graph in FIG. 25. The abscissa of the graph shown in FIG. 25 represents the angle of incidence of light, and the ordinate represents the output value (sensitivity) of the pixels according to the incident light.

In FIG. 25, the solid line graph is a graph showing the sensitivity of the photodiodes 214 in the phase difference detection pixels provided with the light shield walls 306 for the light shield film 216-2 indicated by the solid line in FIG. 24. In FIG. 25, the dashed line graph is a graph showing the sensitivity of the photodiodes 214 in the phase difference detection pixels without the light shield walls 306 for the light shield film 216-2' indicated by the dashed line in FIG. 24.

FIG. 25 shows that providing the light shield walls 306 can increase the maximum value of sensitivity and decrease the minimum value. In other words, providing the light shield walls 306 for the phase difference detection pixels can increase higher outputs and decrease lower outputs in the acceptance angle distribution. Such properties can provide phase difference detection pixels having improved resolution. In addition, formation of light shield walls on a light shield film for the phase difference detection pixels does not change the structure of the imaging pixels and thus does not affect the properties of the image capturing pixels, enabling the above adjustment of the properties of the phase difference detection pixels.

As described above, higher outputs and lower outputs in the acceptance angle distribution can be controlled to obtain desired outputs by adjusting the length of the light shield film 216 (the cover area of the light shield film 216 over the photodiodes 214), providing the light shield walls 304 to 306 on the surface of the light shield film 216 facing the photodiodes 214 and adjusting the height of the light shield walls 304 to 306.

<Configuration of Focus Detecting Device According to Seventh Embodiment>

Figure 26:
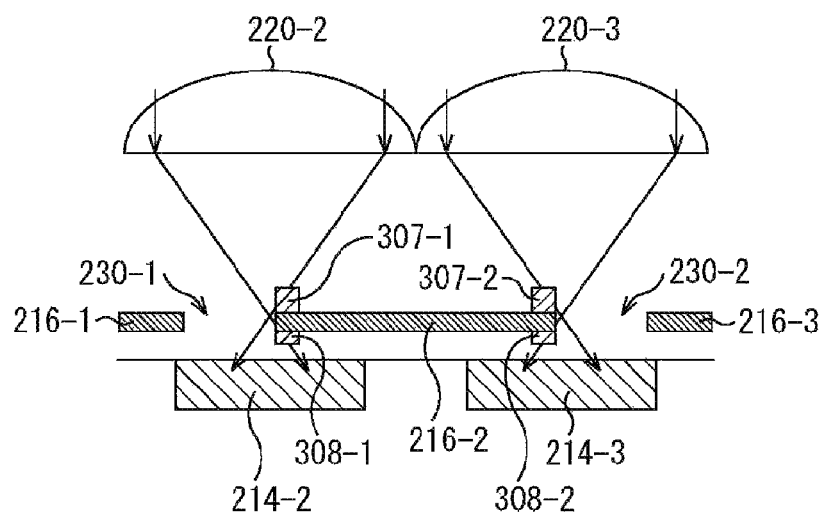
FIG. 26 is a diagram illustrating the configuration of the focus detecting device according to the seventh embodiment.

FIG. 26 is a side sectional view of phase difference detection pixels in a focus detecting device according to a seventh embodiment. In the phase difference detection pixels in the focus detecting device shown in FIG. 26, the same reference numerals are given to the same parts as in the phase difference detection pixels in the focus detecting device shown in FIGS. 16 and 22, and the description on the same parts is appropriately omitted.

The phase difference detection pixels shown in FIG. 26 have the same configuration as the phase difference detection pixels shown in FIG. 16 or 22 except that light shield walls are provided on the upper and lower surfaces of the light shield film 216-2. That is, the phase difference detection pixels shown in FIG. 26 include light shield walls 307 on the upper surface of the light shield film 216-2 facing the microlenses 220 in the same manner as in the phase difference detection pixels shown in FIG. 16 and include light shield walls 308 on the lower surface of the light shield film 216-2 facing the photodiodes 214.

A light shield wall 307-1 is provided on the upper surface of the light shield film 216-2 facing the microlens 220-2, and a light shield wall 307-2 is provided on the upper surface of the light shield film 216-2 facing the microlens 220-3. A light shield wall 308-1 is provided on the lower surface of the light shield film 216-2 closer to the photodiode 214-2, and a light shield wall 308-2 is provided on the lower surface of the light shield film 216-2 closer to the photodiode 214-3.

The light shield walls 307-1 and 307-2 are located at the ends of the light shield film 216-2 and provided to have a predetermined vertical height to the light shield film 216-2. The light shield walls 308-1 and 308-2 are also located at the ends of the light shield film 216-2 and provided to have a predetermined vertical height to the light shield film 216-2.

The description is continued here provided that the light shield walls 307 and 308 are provided on the light shield film 216-2, but the light shield walls 307 and 308 may be also provided on the light shield film 216-1 and/or the light shield film 216-3.

In the phase difference detection pixels shown in FIG. 26, the light shield walls 307 and 308 are provided on the upper and lower surfaces of the light shield film 216-2, respectively.

Figure 27:
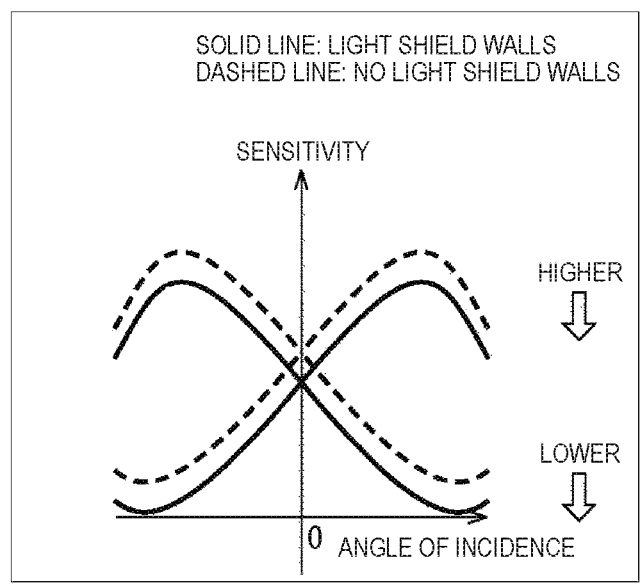
FIG. 27 is a diagram illustrating acceptance angle distribution according to the seventh embodiment.

The acceptance angle distribution for the phase difference detection pixel having such a configuration is shown in FIG. 27. The abscissa of the graph shown in FIG. 27 represents the angle of incidence of light, and the ordinate represents the output value (sensitivity) of the pixels according to the incident light.

The solid line graph in FIG. 27 represents the sensitivity of the photodiodes 214 in the phase difference detection pixels provided with the light shield walls 307 and 308 shown in FIG. 26. The dashed line graph in FIG. 27 represents the sensitivity of the photodiodes 214 in the phase difference detection pixels with no light shield wall 307 or 308.

FIG. 27 shows that providing the light shield walls 307 and 308 can decrease the maximum value of sensitivity and decrease the minimum value of sensitivity. In other words, providing the light shield walls 307 and 308 for the phase difference detection pixels can decrease both higher outputs and lower outputs in the acceptance angle distribution.

As shown in FIG. 26, the light shield walls can be provided on the upper and lower surfaces of the light shield film, respectively. Such a configuration can provide the features as shown in FIG. 27 and allows adjust higher and lower outputs in the acceptance angle distribution to be adjusted so as to obtain desired outputs. In addition, formation of light shield walls on a light shield film for the phase difference detection pixels does not change the structure of the imaging pixels and thus does not affect the properties of the image capturing pixels, enabling the above adjustment of the properties of the phase difference detection pixels.

Although FIG. 26 illustrates an example in which the light shield walls 307 and 308 are aligned on the light shield film 216, the light shield walls 307 and 308 may be disposed in different positions on the light shield film 216.

The light shield film 216-2 may be shortened (the cover area over the photodiodes 214 may be reduced).

<Configuration of Focus Detecting Device According to Eighth Embodiment>

The first to seventh embodiments illustrate examples in which light shield walls are provided vertically to the light shield film 216. An eighth embodiment describes that higher and lower outputs in the acceptance angle distribution can be controlled by a light shield film provided in parallel to the light shield film 216 to obtain desired outputs similarly to the first to seventh embodiments.

Figure 28:
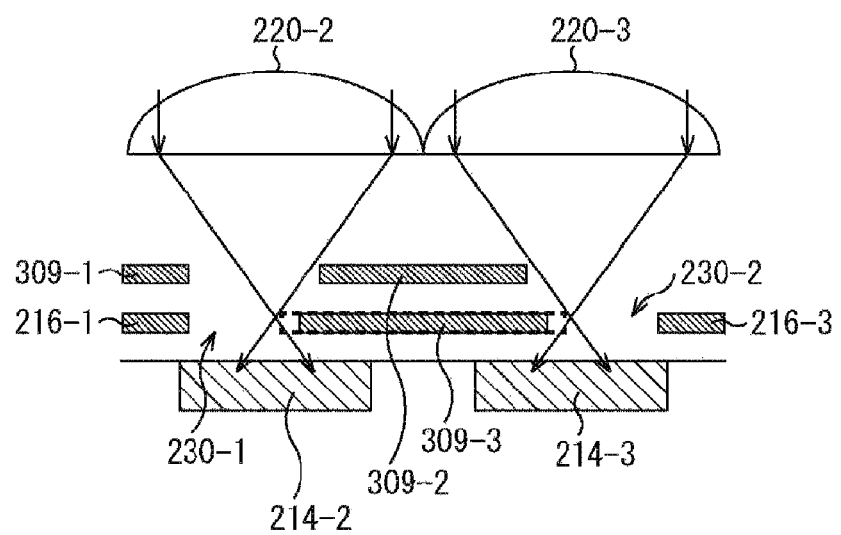
FIG. 28 is a diagram illustrating the configuration of the focus detecting device according to the eighth embodiment.

FIG. 28 is a diagram illustrating the configuration of phase difference detection pixels according to an eighth embodiment. In the phase difference detection pixels shown in FIG. 28, the same reference numerals are given to the same parts as in the phase difference detection pixels shown in FIG. 26, and the description on the same parts is omitted.

In the phase difference detection pixels shown in FIG. 28, a light shield film 309-1 is provided between the light shield film 216-1 and the microlens 220-2, wherein the light shield film 309-1 is in parallel with the light shield film 216-1. Similarly, a light shield film 309-2 is provided between the light shield film 216-2 and the microlenses 220-2 and 220-3, wherein the light shield film 309-2 is in parallel with the light shield film 216-2. Similarly, a light shield film 309-3 is provided between the light shield film 216-3 and the microlens 220-3, wherein the light shield film 309-3 is in parallel with the light shield film 216-3.

In the phase difference detection pixels shown in FIG. 28, the light shield films 216-1 and 309-1 have the same length. The light shield films 216-3 and 309-3 also have the same length. Unlike these films, the light shield films 216-2 and 309-2 have a different length.

When two light shield films are provided in this way, higher outputs in the acceptance angle distribution can be controlled by the light shield film 309 closer to the microlenses 220, and lower outputs in the acceptance angle distribution can be controlled by the light shield film 216 closer to the photodiodes 214.

In this way, higher outputs and lower outputs in the acceptance angle distribution can be controlled individually by adjusting the cover area of the light shield films 216 and 309.

Figure 29:
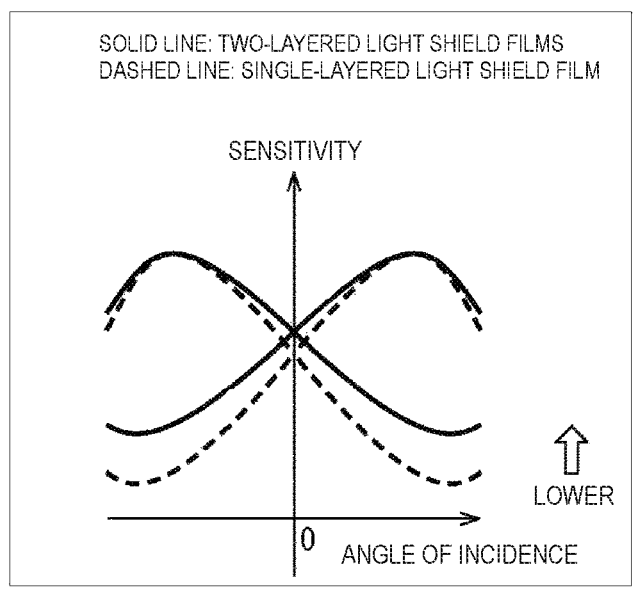
FIG. 29 is a diagram illustrating acceptance angle distribution according to the eighth embodiment.

In the example shown in FIG. 28, the length (cover area) of the light shield film 309-2 is shorter (smaller) than the length (cover area) of the light shield film 216-2. The acceptance angle distribution for the phase difference detection having two films thus formed is shown in FIG. 29. The abscissa of the graph shown in FIG. 29 represents the angle of incidence of light, and the ordinate represents the output value (sensitivity) of the pixels according to the incident light.

The solid line graph in FIG. 29 represents the sensitivity of the photodiodes 214 in the phase difference detection pixels having two-layered light shield films shown in FIG. 28. The dashed line graph in FIG. 29 represents the sensitivity of the photodiodes 214 in the phase difference detection pixels having single-layered light shield films.

FIG. 29 shows that the maximum value of sensitivity can be maintained and the minimum value of sensitivity can be decreased by providing two-layered light shield films. In other words, providing two-layered light shield walls for the phase difference detection pixels can decrease lower outputs while maintaining higher outputs in the acceptance angle distribution.

As described above, higher outputs and lower outputs in the acceptance angle distribution can be controlled to obtain desired outputs by adjusting the length (cover area) of two-layered light shield films. In addition, formation of multiple light shield walls on a light shield film for the phase difference detection pixels does not change the structure of the imaging pixels and thus does not affect the properties of the image capturing pixels, enabling the above adjustment of the properties of the phase difference detection pixels.

Although FIG. 28 illustrates an example of the phase difference detection pixels having two-layered light shield films, light shield films are not limited to two-layered light shield films, and may be three-layered or multi-layered light shield films.

The present technology accordingly allows individual control of higher outputs and lower outputs of sensitivity in the acceptance angle distribution without changing the properties of the imaging pixels For example, lower outputs alone can be increased while higher outputs are maintained in the acceptance angle distribution of the phase difference detection pixels without varying the properties of the imaging pixels, and the phase difference detection pixels can be also used as imaging pixels while maintaining some phase difference detection properties.

When only lower outputs are further decreased while higher outputs are maintained in the acceptance angle distribution of the phase difference detection pixels without varying the properties of the imaging pixels, phase difference detection properties can be improved.

<Application Examples>

Application examples of a focus detecting device including the above phase difference detection pixels will be described below. The solid-state image sensor in the above embodiments can be applied to electronic devices in various fields. In addition to the imaging device (camera) shown in FIG. 1, an endoscope camera and a vision tip (artificial retina) will be described here as examples.

Figure 30:
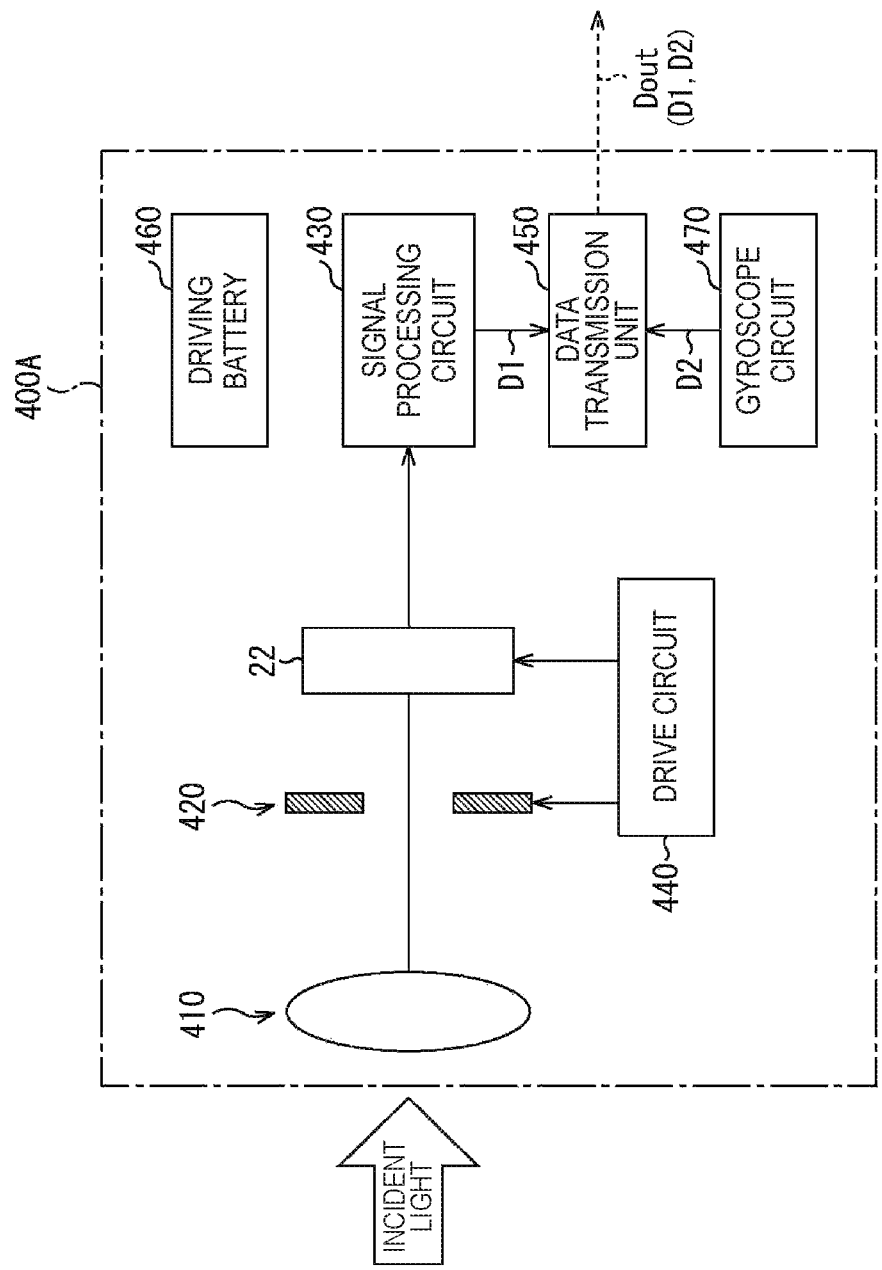
FIG. 30 is a functional block diagram illustrating an entire configuration according to an application example (capsule-type endoscope camera).

FIG. 30 is a functional block diagram illustrating the entire configuration of an endoscope camera (capsule-type endoscope camera 400A) according to an application example. The capsule-type endoscope camera 400A includes an optical system 410, a shutter device 420, a solid-state image sensor 22, a drive circuit 440, a signal processing circuit 430, a data transmission unit 450, a driving battery 460, and an attitude (direction, angle)-sensing gyroscope circuit 470.

The optical system 410 includes one or more imaging lenses that allow image light (incident light) reflected from a subject to form an image on the imaging surface of the solid-state image sensor 22. The shutter device 420 controls the light irradiation period (exposure period) and the light shielding period for the solid-state image sensor 22. The drive circuit 440 drives opening and closing of the shutter device 420 and also drives the exposure operation and signal read operation in the solid-state image sensor 22.

The signal processing circuit 430 performs various types of correction processing, such as given signal processing (e.g., demosaicing, white balance adjustment) on output signals from the solid-state image sensor 22.

The optical system 410 desirably enables multi-directional (e.g., omnidirectional) imaging in four-dimensional space and includes one or more lenses. It is noted that, in this example, picture signals D1 after signal processing in the signal processing circuit 430 and attitude-sensing signals D2 outputted from the gyroscope circuit 470 are wirelessly transmitted to an external device through the data transmission unit 450.

Figure 31:
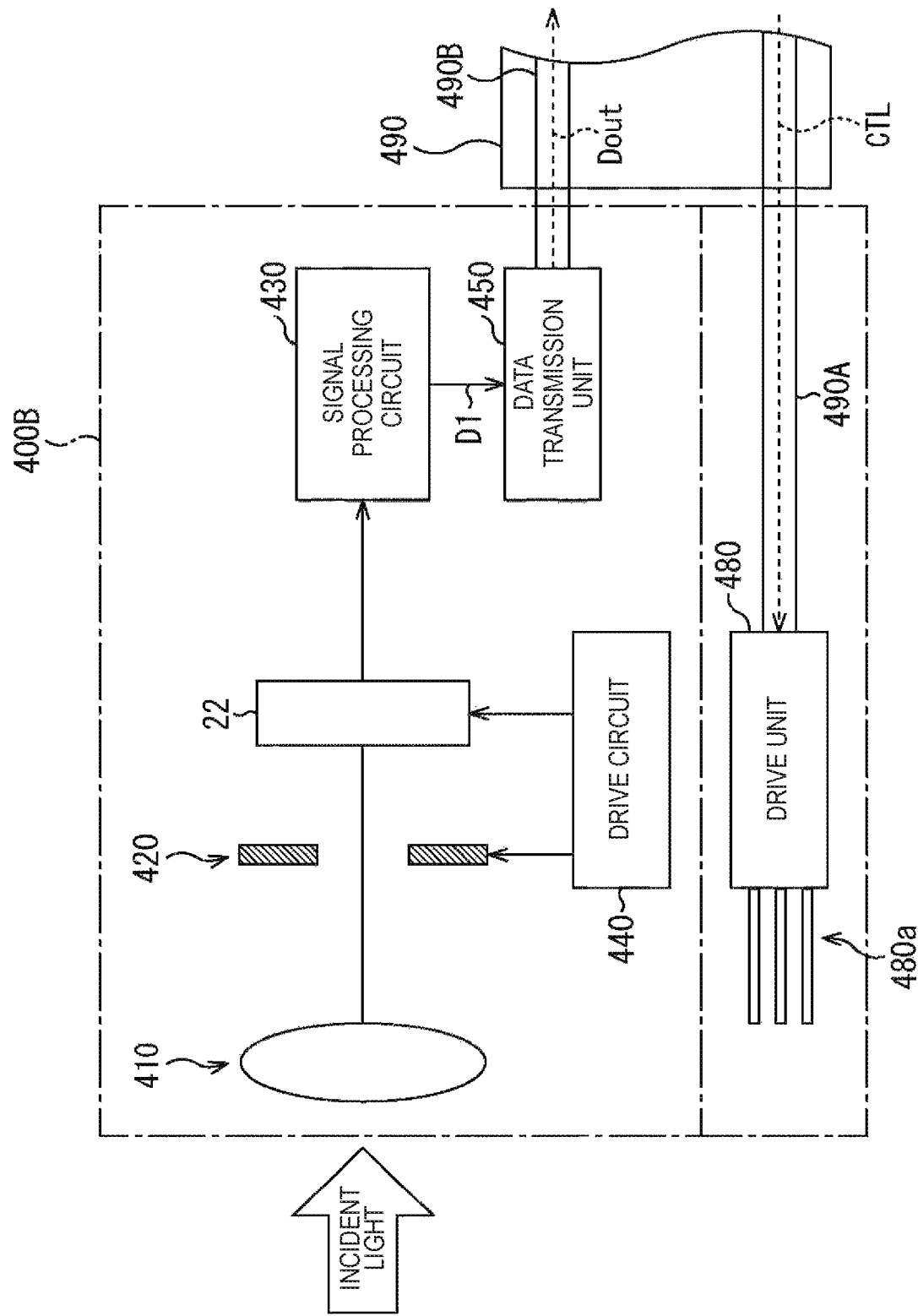
FIG. 31 is a functional block diagram illustrating an entire configuration according to an application example (insert-type endoscope camera).

Endoscope cameras that can employ the image sensors according to the above embodiments are not limited to the capsule type as described above and may be, for example, the insert-type endoscope camera (insert-type endoscope camera 400B) as shown in FIG. 31.

The insert-type endoscope camera 400B includes an optical system 410, a shutter device 420, a solid-state image sensor 22, a drive circuit 440, a signal processing circuit 430, and a data transmission unit 450, which are the same as some of the components in the capsule-type endoscope camera 400A. It is noted that the insert-type endoscope camera 400B further includes an arm 480a retractable within the device and a drive unit 480 configured to drive the arm 480a. The insert-type endoscope camera 400B is connected to a cable 490 having wiring 490A configured to transmit arm control signals CTL to the drive unit 480, and wiring 490B configured to transmit picture signals $D_{out}$ based on image shots.

FIG. 32 is a functional block diagram illustrating the entire configuration of a vision chip (vision tip 500) according to another application example. The vision chip 500 is an artificial retina implantable in a part of the back wall of an eyeball E1 of the eye (retina E2 having the optic nerve) for use. The vision chip 500 is implanted, for example, in a part of any of ganglion cells C1, horizontal cells C2, and visual cells C3 in the retina E2. The vision chip 500 includes, for example, a solid-state image sensor 22, a signal processing circuit 510, and a stimulating electrode unit 520.

The vision chip 500 with such a configuration involves acquiring electric signals based on light incident on the eye in the solid-state image sensor 22, processing the electric signals in the signal processing circuit 510, and supplying predetermined control signals to the stimulating electrode unit 520. The stimulating electrode unit 520 has a function of providing the optic nerve with stimulation (electric signals) according to the inputted control signals.

As used herein, the system refers to the entire device including multiple devices.

The advantages described herein are illustrative only and should not be construed as restrictive, and other advantages may be provided.

The embodiments according to the present technology are not limited to the embodiments described above and various modifications can be made without departing from the spirit of the present technology.

Additionally, the present technology may also be configured as below.

(1)

A focus detecting device including:

a microlens;

a photoreceptor configured to receive light entering through the microlens;

a light shield film provided between the microlens and the photoreceptor and configured to limit an amount of light on the photoreceptor; and a light shield wall provided vertical to the light shield film.

(2)

A focus detecting device according to (1), wherein the light shield wall is provided at an opening of the light shield film.

(3)

The focus detecting device according to (1) or (2), wherein the light shield wall is provided on a surface of the light shield film facing the microlens.

(4)

The focus detecting device according to (1) or (2), wherein the light shield wall is provided on a surface of the light shield film facing the photoreceptor.

(5)

The focus detecting device according to (1) or (2), wherein the light shield walls are provided on both surfaces of the light shield film facing the microlens and the photoreceptor.

(6)

The focus detecting device according to (1) or (2), wherein a cover area of the light shield film over the photoreceptor is reduced and the light shield wall having, a predetermined height is provided on a surface of the light shield film facing the microlens to maintain a maximum value of sensitivity of the photoreceptor obtained when the focus detecting device includes the light shield film without the light shield wall, and to increase a minimum value of the sensitivity.

(7)

The focus detecting device according to (1) or (2), wherein the light shield wall having a predetermined height is provided on a surface of the light shield film facing the microlens to maintain a minimum value of sensitivity of the photoreceptor obtained when the focus detecting device includes the light shield film without the light shield wall, and to decrease a maximum value of the sensitivity.

(8)

The focus detecting device according to (1) or (2), wherein a cover area of the light shield film over the photoreceptor is reduced and the light shield wall having a predetermined height is provided on a surface of the light shield film facing the microlens to decrease a maximum value of sensitivity of the photoreceptor obtained when the focus detecting device includes the light shield film without the light shield wall, and to increase a minimum value of the sensitivity.

(9)

The focus detecting device according to (1) or (2), wherein a cover area of the light shield film over the photoreceptor is reduced and the light shield wall having a predetermined height is provided on a surface of the light shield film facing the photoreceptor to maintain a minimum value of sensitivity of the photoreceptor obtained when the focus detecting device includes the light shield film without the light shield wall, and to increase a maximum value of the sensitivity.

(10)

The focus detecting device according to (1) or (2), wherein the light shield wall having a predetermined height is provided on a surface of the light shield film facing the photoreceptor to maintain a maximum value of sensitivity of the photoreceptor obtained when the focus detecting device includes the light shield film without the light shield wall, and to increase a minimum value of the sensitivity.

(11)

The focus detecting device according to (1) or (2), wherein a cover area of the light shield film over the photoreceptor is reduced and the light shield wall having a predetermined height is provided on a surface of the light shield film facing the photoreceptor to increase a maximum value of sensitivity of the photoreceptor obtained when the focus detecting device includes the light shield film without the light shield wall, and to decrease a minimum value of the sensitivity.

(12)

The focus detecting device according to (1) or (2), wherein the light shield walls having a predetermined height are provided on both surfaces of the light shield film facing the microlens and the photoreceptor to decrease a maximum value of sensitivity of the photoreceptor obtained when the focus detecting device includes the light shield film without the light shield wall, and to decrease a minimum value of the sensitivity.

(13)

A focus detecting device including:

a microlens;

a photoreceptor configured to receive light entering through the microlens; and a plurality of light shield films provided between the microlens and the photoreceptor and configured to limit an amount of light on the photoreceptor.

(14)

The focus detecting device according to (13), wherein a cover area of a light shield film closer to the microlens, of the plurality of light shield curtains, over the photoreceptor is made smaller than a cover area of a light shield film closer to the photoreceptor over the photoreceptor to maintain a maximum value of sensitivity of the photoreceptor obtained when the light shield films are single-layered, and to increase a minimum value of the sensitivity.

(15)

An electronic device including:

a microlens;

a photoreceptor configured to receive light entering through the microlens;

a light shield film provided between the microlens and the photoreceptor and configured to limit an amount of light on the photoreceptor;

a light shield wall provided vertical to the light shield film;

a detector configured to detect a focus using a signal from the photoreceptor; and a signal processing unit configured to process a signal outputted from the photoreceptor without the light shield film.

(16)

A focus detecting device including:

a lens array including a plurality of lenses;

a photoreceptor including a plurality of light-receiving pixels; and a light shield unit provided between the lens array and the photoreceptor in a first direction, wherein the lens array includes a first lens and a second lens, the photoreceptor includes a first light-receiving pixel opposite to the first lens and a second light-receiving pixel opposite to the second lens, and the light shield unit includes a first protrusion region that overlaps the first lens and protrudes in the first direction and a second protrusion region that overlaps the second lens and protrudes in the first direction.

(17)

The focus detecting device according to (16), wherein the light shield unit includes
- a light shield film that overlaps the first lens and the second lens,
- a first light shield wall that extends in the first direction in the first protrusion region, and
- a second light shield wall that extends in the first direction in the second protrusion region.

(18)

The focus detecting device according to (16) or (17), wherein the first light shield wall and the second light shield wall are thicker than the light shield film in the first direction.

REFERENCE SIGNS LIST 214 photodiode
216 light shield film
220 microlens
230 opening
301, 302, 303, 304, 305, 306, 307, 308 light shield wall
309 light shield film

What is claimed is:

1. A focus detecting device comprising:
   a microlens;
   a photoreceptor configured to receive light entering through the microlens;
   a light shield film provided between the microlens and the photoreceptor, wherein the light shield film is configured to limit an amount of light on the photoreceptor;
   a first light shield wall of a predetermined height provided vertical to the light shield film, wherein the first light shield wall is provided on a surface of the light shield film facing the photoreceptor; and
   a detector configured to detect a focus using a signal from the photoreceptor.

2. The focus detecting device according to claim 1, wherein the first light shield wall is provided at an opening of the light shield film.

3. The focus detecting device according to claim 1, wherein a second light shield wall is provided on a surface of the light shield film facing the microlens.

4. The focus detecting device according to claim 3, wherein the second light shield wall is provided at an opening of the light shield film.

5. The focus detecting device according to claim 1, further comprising a detector to detect a focus using a signal from the photoreceptor.

6. The focus detecting device according to claim 1, wherein a cover area of the light shield film over the photoreceptor is reduced and the first light shield wall maintains a maximum value of sensitivity of the photoreceptor obtained when the focus detecting device includes the light shield film without the light shield wall, and increases a minimum value of the sensitivity.

7. The focus detecting device according to claim 1, wherein the first light shield wall maintains a minimum value of sensitivity of the photoreceptor obtained when the focus detecting device includes the first light shield film without the light shield wall, and decreases a maximum value of the sensitivity.

8. The focus detecting device according to claim 1, wherein a cover area of the light shield film over the photoreceptor is reduced and the first light shield wall decreases a maximum value of sensitivity of the photoreceptor obtained when the focus detecting device includes the light shield film without the first light shield wall, and increases a minimum value of the sensitivity.

9. The focus detecting device according to claim 1, wherein a cover area of the light shield film over the photoreceptor is reduced and the first light shield wall maintains a minimum value of sensitivity of the photoreceptor obtained when the focus detecting device includes the light shield film without the first light shield wall, and increases a maximum value of the sensitivity.

10. The focus detecting device according to claim 1, wherein the first light shield wall increases a maximum value of sensitivity of the photoreceptor obtained when the focus detecting device includes the light shield film without the first light shield wall, and increases a minimum value of the sensitivity.

11. The focus detecting device according to claim 1, wherein a cover area of the light shield film over the photoreceptor is reduced and the first light shield wall increases a maximum value of sensitivity of the photoreceptor obtained when the focus detecting device includes the light shield film without the first light shield wall, and decreases a minimum value of the sensitivity.

12. The focus detecting device according to claim 1, wherein the first light shield wall decreases a maximum value of sensitivity of the photoreceptor obtained when the focus detecting device includes the light shield film without the first light shield wall, and decreases a minimum value of the sensitivity.

13. A focus detecting device comprising:
    a microlens;
    a photoreceptor configured to receive light entering through the microlens;
    a plurality of light shield films provided between the microlens and the photoreceptor and configured to limit an amount of light on the photoreceptor;
    a first light shield wall of a predetermined height provided vertical to the plurality of light shield films, wherein the first light shield wall is provided on a surface of one of the light shield films facing the photoreceptor;
    a second light shield wall provided on a surface of one of the light shield films facing the microlens; and
    a detector configured to detect a focus using a signal from the photoreceptor.

14. The focus detecting device according to claim 13, wherein:
    a cover area of a first light shield film of the plurality of light shield films over the photoreceptor is smaller than a cover area of a second light shield film of the plurality of light shield films over the photoreceptor,
    the first light shield film is closer to the microlens than the second light shield film,
    the second light shield film is closer to the photoreceptor than the first light shield film,
    a maximum value of a sensitivity of the photoreceptor obtained when the light shield films are single-layered is maintained, and
    a minimum value of the sensitivity is increased.

15. An electronic device comprising:
    a microlens;
    a photoreceptor configured to receive light entering through the microlens;
    a light shield film provided between the microlens and the photoreceptor and configured to limit an amount of light on the photoreceptor;

a light shield wall of a predetermined height provided vertical to the light shield film, wherein the light shield wall is provided on a surface of the light shield film facing the photoreceptor;

a detector configured to detect a focus using a signal from the photoreceptor; and a signal processing unit configured to process a signal outputted from the photoreceptor without the light shield film.

* * * * *